(12) United States Patent
Morimoto

(10) Patent No.: US 12,588,305 B2
(45) Date of Patent: Mar. 24, 2026

(54) PHOTOELECTRIC CONVERSION APPARATUS, PHOTOELECTRIC CONVERSION SYSTEM, AND MOVABLE OBJECT

(71) Applicant: CANON KABUSHIKI KAISHA, Tokyo (JP)

(72) Inventor: Kazuhiro Morimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 631 days.

(21) Appl. No.: 17/816,135

(22) Filed: Jul. 29, 2022

(65) Prior Publication Data

US 2022/0384494 A1 Dec. 1, 2022

Related U.S. Application Data

(63) Continuation of application No. PCT/JP2021/001744, filed on Jan. 20, 2021.

(30) Foreign Application Priority Data

Jan. 31, 2020 (JP) .................................. 2020-015607
Jun. 24, 2020 (JP) .................................. 2020-108754
Nov. 2, 2020 (JP) .................................. 2020-183448

(51) Int. Cl.
*H10F 39/00* (2025.01)
*H04N 25/77* (2023.01)
(Continued)

(52) U.S. Cl.
CPC ......... *H10F 39/8033* (2025.01); *H04N 25/77* (2023.01); *H10F 39/182* (2025.01);
(Continued)

(58) Field of Classification Search
CPC .. H10F 39/8033; H10F 39/199; H10F 39/807; H10F 39/811; H10F 30/20;
(Continued)

(56) References Cited

U.S. PATENT DOCUMENTS

2015/0200222 A1* 7/2015 Webster ................ H10F 30/225
250/208.1
2015/0281620 A1 10/2015 Usuda
(Continued)

FOREIGN PATENT DOCUMENTS

CN 101484999 A 7/2009
JP 2014168016 A 9/2014
(Continued)

OTHER PUBLICATIONS

S. M. Sze and Kwok K. Ng, Chapter 2. p-n Junctions, Physics of Semiconductor Devices, 2007, pp. 79-133, Third Edition, A John Wiley & Sons, Jnc., Publication.

*Primary Examiner* — Shahed Ahmed

(74) *Attorney, Agent, or Firm* — Canon U.S.A., Inc. IP Division

(57) ABSTRACT

A first avalanche diode including a first semiconductor region and a second avalanche diode including a second semiconductor region are provided, a first isolation portion is arranged between the first semiconductor region and the second semiconductor region, the first isolation portion is constituted by a third semiconductor region, or a fourth semiconductor regions and the third semiconductor regions arranged to sandwich the fourth semiconductor region in plan view, and in the fourth semiconductor regions, an impurity concentration Nd of the third semiconductor region, an impurity concentration Na of the fourth semiconductor region, an elementary electric charge q, a dielectric constant ε of a semiconductor, a potential difference V between a P-N junction of the third semiconductor region and the fourth semiconductor region, and a length D of the third semiconductor region sandwiched by the fourth semiconductor regions satisfy Expression 1.

(Continued)

$$2 \times \sqrt{\frac{2\varepsilon\,NdV}{qNa(Na + Nd)}} > D$$

13 Claims, 30 Drawing Sheets

(51) Int. Cl.

| | | |
|---|---|---|
| *H10F 39/12* | (2025.01) | |
| *H10F 39/18* | (2025.01) | |
| *H04N 25/531* | (2023.01) | |

(52) U.S. Cl.
CPC ......... *H10F 39/199* (2025.01); *H10F 39/807* (2025.01); *H10F 39/811* (2025.01); *H04N 25/531* (2023.01)

(58) Field of Classification Search
CPC ................... H10F 30/225; H10F 39/12; H10F 39/18–1898; H10F 39/182–1825; H10F 39/802–80377; H04N 25/77; H04N 25/531; H04N 25/773; H04N 25/131; H04N 25/133; H04N 25/134; H04N 25/135; H10D 8/055; H10D 8/40
See application file for complete search history.

(56) References Cited

U.S. PATENT DOCUMENTS

| | | | |
|---|---|---|---|
| 2018/0090536 A1 | 3/2018 | Mandai | |
| 2018/0270405 A1 | 9/2018 | Ota | |
| 2018/0372539 A1* | 12/2018 | Goden | H10F 39/811 |
| 2019/0181177 A1 | 6/2019 | Kobayashi | |
| 2019/0319154 A1* | 10/2019 | Fukuchi | H10F 39/107 |
| 2020/0028018 A1* | 1/2020 | Iwata | H10F 30/225 |

FOREIGN PATENT DOCUMENTS

| | | | |
|---|---|---|---|
| JP | 2018064086 A | 4/2018 | |
| JP | 2018148097 A | 9/2018 | |
| JP | 2018157156 A | 10/2018 | |
| JP | 2018201005 A | 12/2018 | |
| JP | 2019102618 A | 6/2019 | |
| JP | 2019110406 A | 7/2019 | |
| JP | 2019115032 A | 7/2019 | |
| WO | 2014097519 A1 | 6/2014 | |
| WO | 2019106983 A1 | 6/2019 | |
| WO | 2019189700 A1 | 10/2019 | |
| WO | 2019194289 A1 | 10/2019 | |

* cited by examiner

X : AVALANCHE AMPLIFICATION REGION

X: AVALANCHE AMPLIFICATION REGION

QUENCH CIRCUIT/
N-bit COUNTER

QUENCH CIRCUIT/
N-bit COUNTER

FRONT VIEW   1300

1302    1302

TOP VIEW 1303    1302   1302    1300
1313

1312

REAR VIEW

SHARED BY FOUR PIXELS

FIG. 33A

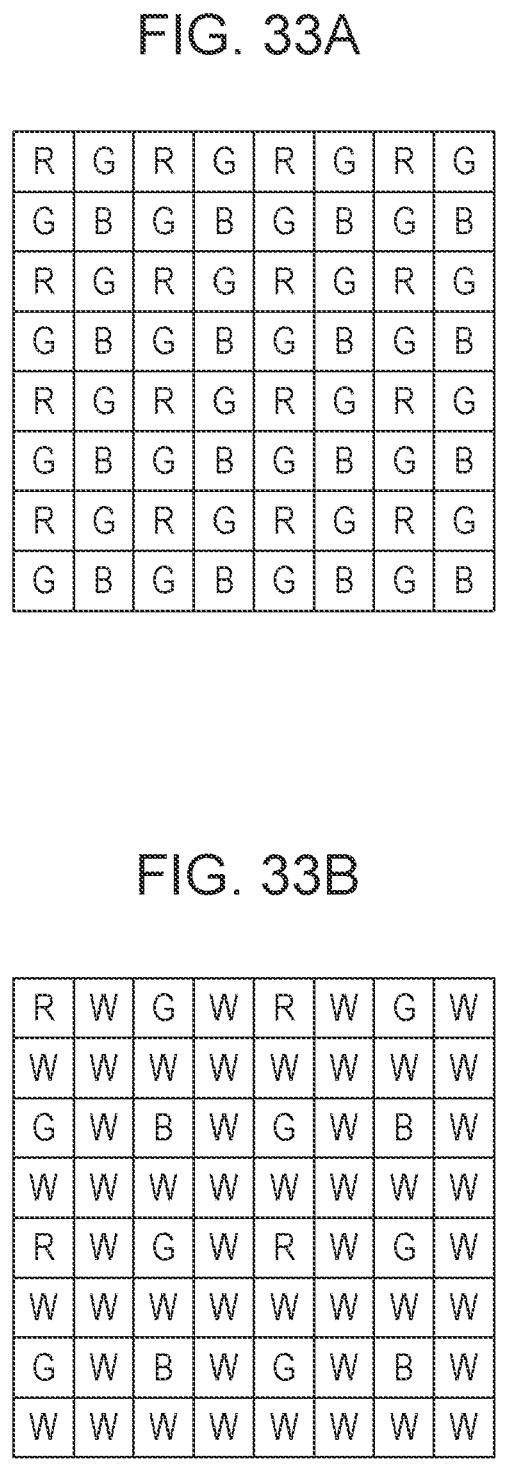

| R | G | R | G | R | G | R | G |
|---|---|---|---|---|---|---|---|
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |

FIG. 33B

| R | W | G | W | R | W | G | W |
|---|---|---|---|---|---|---|---|
| W | W | W | W | W | W | W | W |
| G | W | B | W | G | W | B | W |
| W | W | W | W | W | W | W | W |
| R | W | G | W | R | W | G | W |
| W | W | W | W | W | W | W | W |
| G | W | B | W | G | W | B | W |
| W | W | W | W | W | W | W | W |

FIG. 34

|     | m  | m+1 | m+2 | m+3 | m+4 | m+5 | m+6 | m+7 | m+8 | m+9 | m+10 | m+11 |
|-----|----|-----|-----|-----|-----|-----|-----|-----|-----|-----|------|------|
| n   | R  | IR  | G   | IR  | R   | IR  | G   | IR  | R   | IR  | G    | IR   |
| n+1 | IR | IR  | IR  | IR  | IR  | IR  | IR  | IR  | IR  | IR  | IR   | IR   |
| n+2 | G  | IR  | B   | IR  | G   | IR  | B   | IR  | G   | IR  | B    | IR   |
| n+3 | IR | IR  | IR  | IR  | IR  | IR  | IR  | IR  | IR  | IR  | IR   | IR   |
| n+4 | R  | IR  | G   | IR  | R   | IR  | G   | IR  | R   | IR  | G    | IR   |
| n+5 | IR | IR  | IR  | IR  | IR  | IR  | IR  | IR  | IR  | IR  | IR   | IR   |
| n+6 | G  | IR  | B   | IR  | G   | IR  | B   | IR  | G   | IR  | B    | IR   |
| n+7 | IR | IR  | IR  | IR  | IR  | IR  | IR  | IR  | IR  | IR  | IR   | IR   |
| n+8 | R  | IR  | G   | IR  | R   | IR  | G   | IR  | R   | IR  | G    | IR   |
| n+9 | IR | IR  | IR  | IR  | IR  | IR  | IR  | IR  | IR  | IR  | IR   | IR   |
| n+10| G  | IR  | B   | IR  | G   | IR  | B   | IR  | G   | IR  | B    | IR   |
| n+11| IR | IR  | IR  | IR  | IR  | IR  | IR  | IR  | IR  | IR  | IR   | IR   |

PHOTOELECTRIC CONVERSION APPARATUS, PHOTOELECTRIC CONVERSION SYSTEM, AND MOVABLE OBJECT

CROSS-REFERENCE TO RELATED APPLICATIONS

This application is a Continuation of International Patent Application No. PCT/JP2021/001744, filed Jan. 20, 2021, which claims the benefit of Japanese Patent Application No. 2020-015607, filed Jan. 31, 2020, Japanese Patent Application No. 2020-108754, filed Jun. 24, 2020, and Japanese Patent Application No. 2020-183448, filed Nov. 2, 2020, both of which are hereby incorporated by reference herein in their entirety.

TECHNICAL FIELD

The present invention relates to a photoelectric conversion apparatus, a photoelectric conversion system, and a movable object.

BACKGROUND ART

A photoelectric conversion apparatus that digitally counts the number of photons arriving at a light reception section and outputs a counted value thereof as a digital signal from a pixel has been known. PTL 1 discloses a light detection apparatus using avalanche diodes that cause avalanche multiplication in a P-N junction region of a semiconductor region constituting a photoelectric conversion section. In the light detection apparatus of PTL 1, a high-concentration P-type semiconductor region for forming an electric contact is arranged between N-type semiconductor regions of avalanche diodes adjacent to each other.

CITATION LIST

Patent Literature

PTL 1 Japanese Patent Laid-Open No. 2018-201005

According to PTL 1, when a pixel size is decreased, a distance between a P-type semiconductor region and an N-type semiconductor region constituting an avalanche diode is reduced. When a potential is supplied to the avalanche diode in this state, a local high electric field region is formed by the high-concentration P-type semiconductor region for forming an electric contact and the N-type semiconductor region, and a dark current is likely to be generated.

SUMMARY OF INVENTION

A photoelectric conversion apparatus according to an aspect of the present invention includes a first avalanche diode including a first semiconductor region of a first conductivity type in which majority carriers are charge carriers of the same conductivity type as signal charge, and a second avalanche diode including a second semiconductor region of the first conductivity type and arranged to be adjacent to the first avalanche diode, in which a first isolation portion is arranged between the first semiconductor region and the second semiconductor region, the first isolation portion is constituted by a third semiconductor region of the first conductivity type or the third semiconductor region and fourth semiconductor regions of the second conductivity type, and in the fourth semiconductor regions, an impurity concentration Nd of the third semiconductor region, an impurity concentration Na of the fourth semiconductor region, an elementary electric charge q, a dielectric constant $\varepsilon$ of a semiconductor, a potential difference V between the P-N junction of the third semiconductor region and the fourth semiconductor region, and a length D of the third semiconductor region sandwiched by the fourth semiconductor regions satisfy the following expression.

$$2 \times \sqrt{\frac{2\varepsilon \, NdV}{qNa(Na + Nd)}} > D \qquad \text{[Math. 1]}$$

A photoelectric conversion apparatus according to an aspect of the present invention includes a substrate having a first surface and a second surface opposite the first surface, a first avalanche diode including a first semiconductor region of a first conductivity type which is arranged at a first depth of the substrate and in which majority carriers are charge carriers of the same conductivity type as signal charge, and a fifth semiconductor region of a second conductivity type being a conductivity type different from the first conductivity type arranged at a second depth between the first depth and the second surface, and a second avalanche diode including a second semiconductor region of the first conductivity type arranged at the first depth of the substrate, and a sixth semiconductor region of the second conductivity type arranged at the second depth, the second avalanche diode being arranged to be adjacent to the first avalanche diode, in which a first isolation portion is arranged at the first depth between the first semiconductor region and the second semiconductor region, at least one of an intrinsic semiconductor region, a third semiconductor region of the first conductivity type, and a fourth semiconductor region of the second conductivity type is arranged in the first isolation portion, a seventh semiconductor region of the second conductivity type is arranged at the second depth between the fifth semiconductor region and the sixth semiconductor region, and a height of a potential with respect to the signal charge on a line passing through the first isolation portion and the seventh semiconductor region decreases from the seventh semiconductor region toward the first isolation portion, and a difference between a height of the potential with respect to the signal charge in the first semiconductor region and a height of the potential with respect to the signal charge in the fifth semiconductor region is larger than a difference between a height of the potential with respect to the signal charge in the first isolation portion and a height of the potential with respect to the signal charge in the seventh semiconductor region.

A photoelectric conversion apparatus according to an aspect of the present invention includes a first avalanche diode including a first semiconductor region of a first conductivity type in which majority carriers are charge carriers of the same conductivity type as signal charge, and a second avalanche diode including a second semiconductor region of the first conductivity type and arranged to be adjacent to the first avalanche diode, and includes a first counter circuit configured to count an avalanche current generated by avalanche multiplication in the first avalanche diode, and a second counter circuit different from the first counter circuit and configured to count an avalanche current generated by avalanche multiplication in the second avalanche diode, and in plan view, a contact plug that applies a bias voltage to one node of the first avalanche diode is not arranged between the first semiconductor region and the second semiconductor region.

Further features of the present invention will become apparent from the following description of exemplary embodiments with reference to the attached drawings.

BRIEF DESCRIPTION OF DRAWINGS

FIG. 30A is an experimental example of the photoelectric conversion system according to the fifteenth embodiment.

FIG. 30B is an experimental example of the photoelectric conversion system according to the fifteenth embodiment.

FIG. 30C is an experimental example of the photoelectric conversion system according to the fifteenth embodiment.

FIG. 33A is an arrangement example of pixels and filters according to the seventeenth embodiment.

FIG. 33B is an arrangement example of the pixels and the filters according to the seventeenth embodiment.

FIG. 34 is an arrangement example of the pixels and the filters according to the seventeenth embodiment.

DESCRIPTION OF EMBODIMENTS

Embodiments which will be illustrated below are for embodying a technical concept of the present invention, and are not for restricting the present invention. Sizes and a positional relationship of members illustrated in each of the drawings may be exaggerated for clarifying descriptions. In the following description, the same number is assigned to the same configuration, and descriptions thereof may be omitted.

The embodiments to be illustrated below are related, in particular, to a photoelectric conversion apparatus including a SPAD (Single Photon Avalanche Diode) that counts the number of photons incident on an avalanche diode. The photoelectric conversion apparatus includes at least an avalanche diode.

In the following description, an anode of the avalanche diode has a fixed potential, and a signal is taken from a cathode side. Therefore, a semiconductor region of a first conductivity type in which majority carriers are charge carries of the same conductivity type as signal charge refers to an N-type semiconductor region, and a semiconductor region of a second conductivity type refers to a P-type semiconductor region. It is noted that even in a case where a cathode of the avalanche diode has a fixed potential and a signal is taken from an anode side, the present invention is established. In this case, a semiconductor region of a first conductivity type in which majority carriers are charge carriers of the same conductivity type as signal charge refers to a P-type semiconductor region, and a semiconductor region of a second conductivity type refers to an N-type semiconductor region. A case will be described below where a fixed potential is set at one of the nodes of the avalanche diode, but potentials at both nodes may fluctuate.

Figure 1:
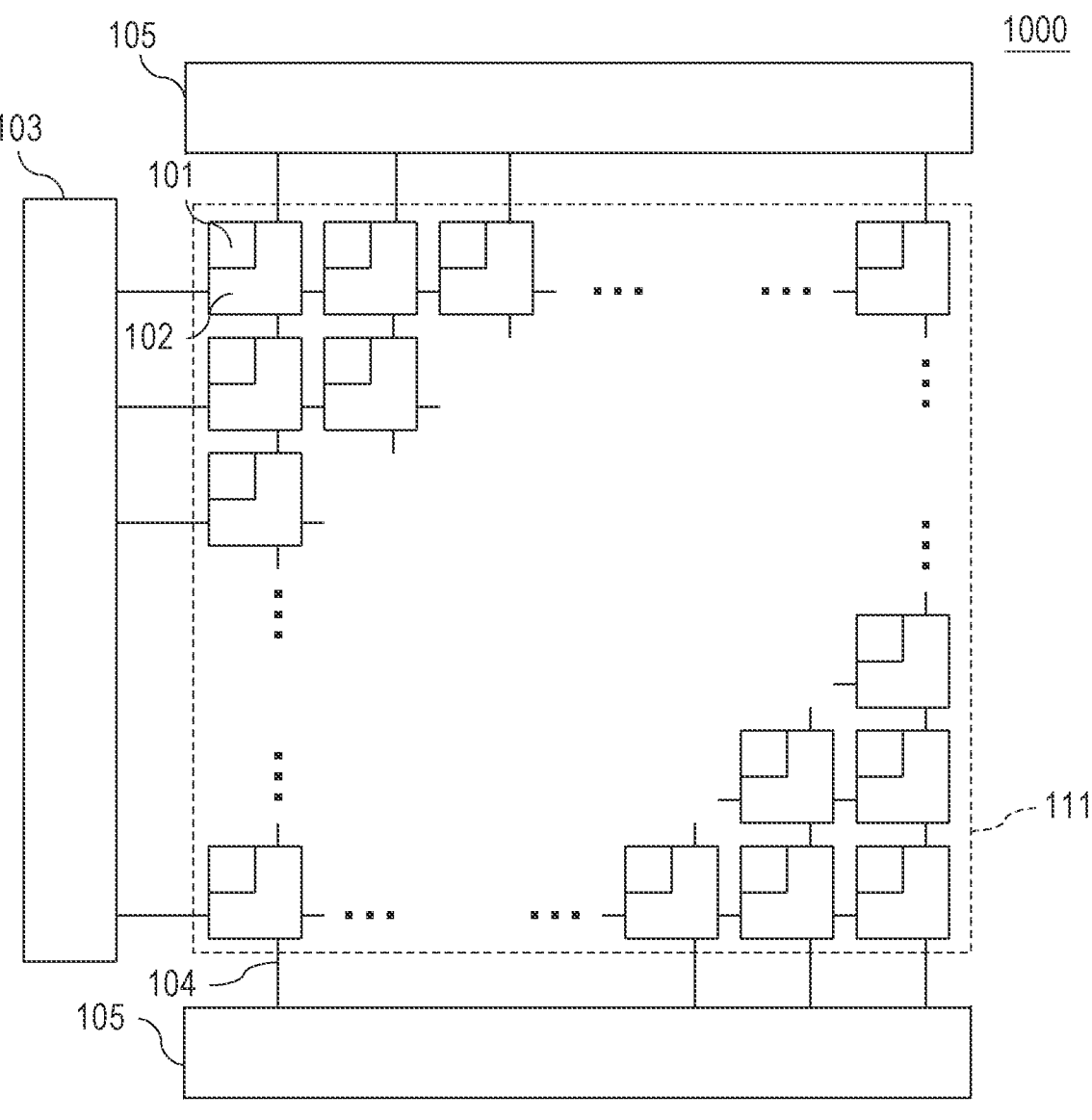
FIG. 1 is a block diagram of a photoelectric conversion apparatus.

FIG. 1 is a block diagram of a photoelectric conversion apparatus 1000 of the present embodiment. The photoelectric conversion apparatus 1000 has a pixel region 111, a horizontal scanning circuit section 105, signal lines 104, and a vertical scanning circuit section 103.

A plurality of pixels 110 are two-dimensionally arranged in the pixel region 111. One pixel 110 is constituted by a photoelectric conversion section 101 and a pixel signal processing section 102. The photoelectric conversion section 101 converts light into an electric signal. The pixel signal processing section 102 outputs the converted electric signal to the signal line 104.

The vertical scanning circuit section 103 and the horizontal scanning circuit section 105 supply a control pulse to each of the pixels 110. A logic circuit such as a shift resister or an address decoder is used as the vertical scanning circuit section 103.

Each signal line 104 supplies, as a potential signal, a digital signal output from the pixel 110 selected by the vertical scanning circuit section 103 to a circuit in a later stage of the pixel 110.

In FIG. 1, an array of the pixels 110 in the pixel region 111 may be one-dimensionally arranged. In addition, the pixel region 111 may be divided into blocks each having a plurality of pixel columns, and the vertical scanning circuit section 103 and the horizontal scanning circuit section 105 may be arranged for each of the blocks. In addition, the vertical scanning circuit section 103 and the horizontal scanning circuit section 105 may be arranged for each of the pixel columns.

The function of the pixel signal processing section 102 is not necessarily provided for each of the pixels 110, and a single pixel signal processing section 102 may be shared by a plurality of pixels 110, for example, and signal processing may be sequentially performed. In addition, to increase an opening ratio of the photoelectric conversion section 101, at least part of the pixel signal processing section 102 may be provided on a semiconductor substrate (second substrate) different from that of the photoelectric conversion section 101. In this case, the photoelectric conversion section 101 and the pixel signal processing section 102 are electrically connected to each other via a connection wire provided for each of the pixels. An avalanche diode of the photoelectric conversion section 101 is preferably arranged on the first substrate, and other configurations are preferably arranged on the second substrate. The vertical scanning circuit section 103, the horizontal scanning circuit section 105, and the signal lines 104 may be provided on the second substrate.

Figure 2:
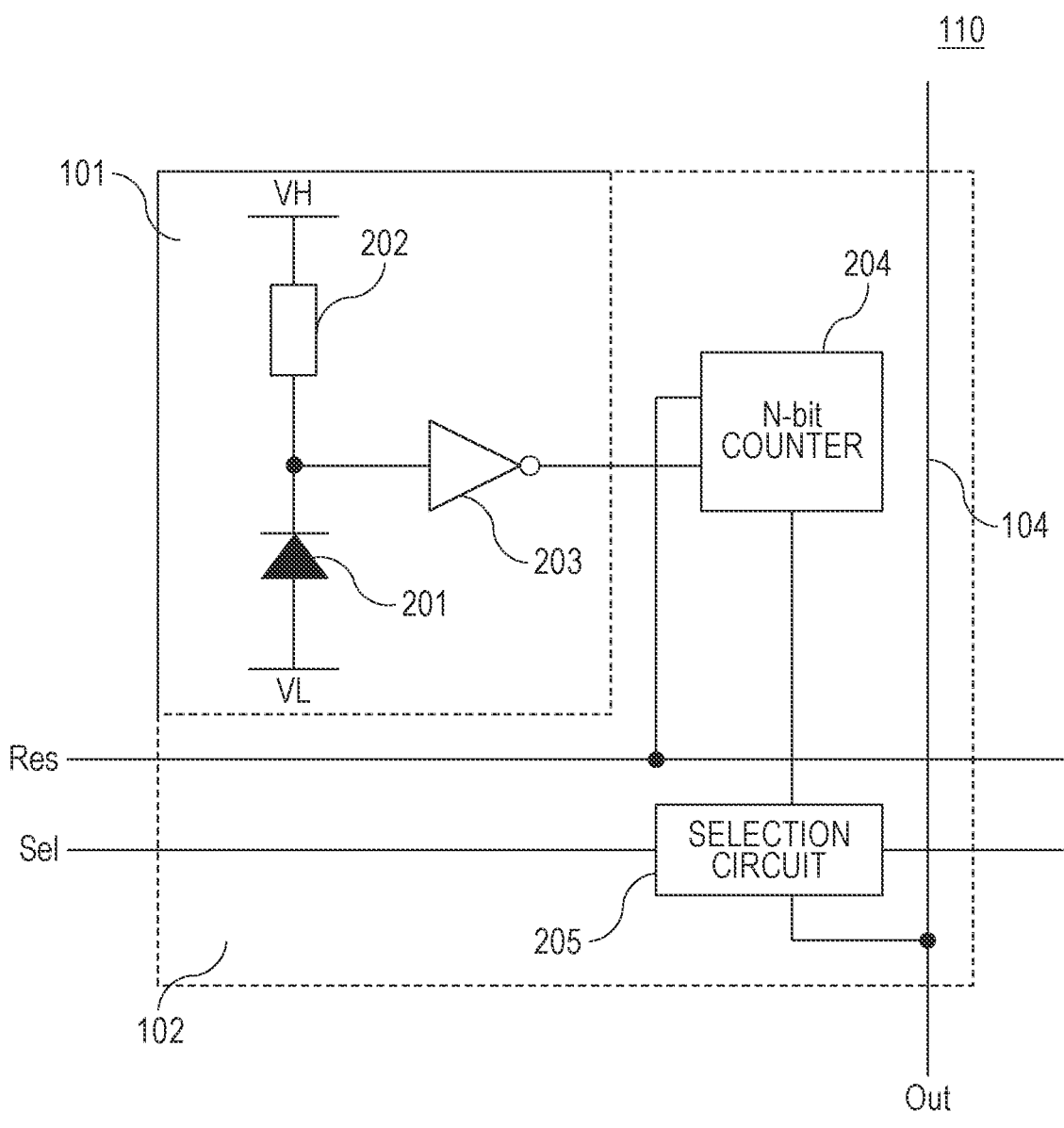
FIG. 2 is a block diagram of a pixel.

FIG. 2 is a block diagram of the pixel 110 including an equivalent circuit according to the present embodiment. In FIG. 2, the single pixel 110 is constituted by the photoelectric conversion section 101 and the pixel signal processing section 102.

The photoelectric conversion section 101 has one or a plurality of arrayed avalanche diodes 201, a quench element 202, and a waveform shaping section 203.

The avalanche diode 201 generates a charge pair according to incident light by photoelectric conversion. A potential based on a potential VH that is higher than a potential VL supplied to an anode is supplied to a cathode of the avalanche diode 201. Then, the anode and the cathode of the avalanche diode 201 are supplied with potentials with such a reverse bias such that a photon incident on the avalanche diode 201 is subjected to avalanche multiplication. When photoelectric conversion is performed in a state where the potentials of the reverse bias are supplied, charge generated by the incident light causes the avalanche multiplication to generate an avalanche current.

In a case where the potentials of the reverse bias are supplied, when a potential difference between the anode and the cathode is larger than a breakdown voltage, the avalanche diode enters Geiger mode operation. An avalanche diode that performs fast detection of a feeble signal at a single photon level using Geiger mode operation is a SPAD (Single Photon Avalanche Diode).

The quench element 202 is connected to a power source that supplies the high potential VH and the avalanche diode 201. The quench element 202 is constituted by a P-type MOS transistor or a resistor element such as a poly resistor. In addition, the quench element 202 may be constituted by a plurality of serial MOS transistors. When a photocurrent is multiplied by the avalanche multiplication in the avalanche diode 201, a current obtained by multiplied charge flows to a connection node between the avalanche diode 201 and the quench element 202. Because of a voltage drop due to this current, a potential at the cathode of the avalanche diode 201 is decreased, and the avalanche diode 201 no longer forms electron avalanche. In this manner, the avalanche multiplication of the avalanche diode 201 stops. Thereafter, since the potential VH of the power source is supplied to the cathode of the avalanche diode 201 via the quench element 202, the potential supplied to the cathode of the avalanche diode 201 returns to the potential VH. That is to say, an operation region of the avalanche diode 201 enters Geiger mode operation again. In this manner, the quench element 202 functions as a load circuit (quench circuit) at the time of charge multiplication by the avalanche multiplication, and suppresses the avalanche multiplication (quench operation). In addition, the quench element causes the operation region of the avalanche diode to enter Geiger mode again after the avalanche multiplication is suppressed.

The waveform shaping section 203 is connected to a connection node between the node of the avalanche diode 201 and the node of the quench element 202. By shaping a change in potential at the cathode of the avalanche diode 201 which is obtained at the time of photon detection, a rectangular pulse signal is output. For example, an inverter circuit is used as the waveform shaping section 203. An example has been illustrated in which a single inverter is used as the waveform shaping section 203, but a circuit obtained by connecting a plurality of inverters in series may be used. Not only the inverter but also other circuits having a waveform shaping effect may be used.

The pixel signal processing section 102 has a counter circuit 204 and a selection circuit 205.

The counter circuit 204 is connected to the waveform shaping section 203. A pulse signal output from the waveform shaping section 203 is counted by the counter circuit 204. In a case where the counter circuit 204 is, for example, an N-bit counter (N: a positive integer), the pulse signal of the single photon can be counted up to approximately the N-th power of 2 as a maximum. The counted signals are held as detected signals. In addition, when a control pulse Res is supplied via a control line, the signals held in the counter circuit 204 are reset.

The selection circuit 205 is connected to the counter circuit 204 and the signal line 104. A control pulse Sel is supplied to the selection circuit 205 from the vertical scanning circuit section 103 of FIG. 1 via a control line, and whether or not a counted value of the counter circuit 204 is to be output to the signal line 104 is switched. The selection circuit 205 includes, for example, a buffer circuit or the like configured to output a signal.

It is noted that a switch such as a transistor may be arranged between the quench element 202 and the avalanche diode 201 to switch between a mode in which the avalanche diode 201 can perform the avalanche multiplication and a mode in which the avalanche diode 201 cannot perform the avalanche multiplication. Similarly, the supply of the potential at the high potential VH or the low potential VL supplied to the avalanche diode 201 may be electrically switched using a switch such as a transistor. In addition, a switch such as a transistor may be arranged between the photoelectric conversion section 101 and the pixel signal processing section 102 to control input of a signal from the photoelectric conversion section 101 to the counter circuit 204.

In the pixel region 111 in which the plurality of pixels 110 are arranged in a matrix shape, a picked-up image may be obtained by a rolling shutter operation in which the count of the counter circuit 204 is sequentially reset for each row and in which the signals held in the counter circuit 204 are sequentially output for each row.

Alternatively, a picked-up image may be obtained by a global electronic shutter operation in which the count of the counter circuit 204 for all the pixel rows is reset at the same time, and the signals held in the counter circuit 204 are sequentially output for each row. It is noted that in a case where the global electronic shutter operation is performed, means for switching between a case where the count of the counter circuit 204 is performed and a case where the count is not performed are preferably provided. The means for switching refer to, for example, the switch described above.

FIG. 2 illustrates a configuration using the counter circuit 204. Instead of the counter circuit 204, a configuration for obtaining pulse detection timing using a time to digital conversion circuit (Time to Digital Converter: hereinafter, TDC) or a memory may be adopted.

At this time, generation timing of the pulse signal output from the waveform shaping section 203 is converted into a digital signal by the TDC. For measurement of the timing of the pulse signal, a control pulse Ref (reference signal) is supplied to the TDC via a drive line from the vertical scanning circuit section 103 of FIG. 1. The TDC obtains, as a digital signal, a signal when input timing of the signal output from each pixel via the waveform shaping section 203 is set as relative time by using a control pulse pREF as a reference.

First Embodiment

A configuration of a photoelectric conversion apparatus according to a first embodiment will be described using FIG. 3 to FIGS. 5A to 5C.

Figure 3:
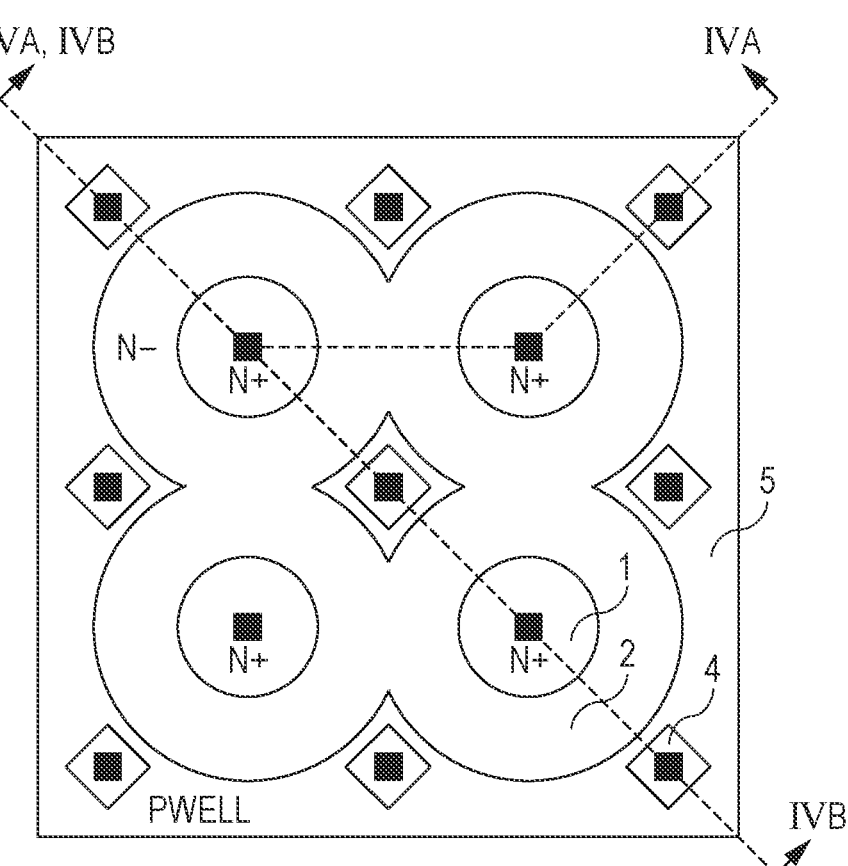
FIG. 3 is a partially enlarged plan view of a photoelectric conversion apparatus of a first embodiment.
Figure 4A:
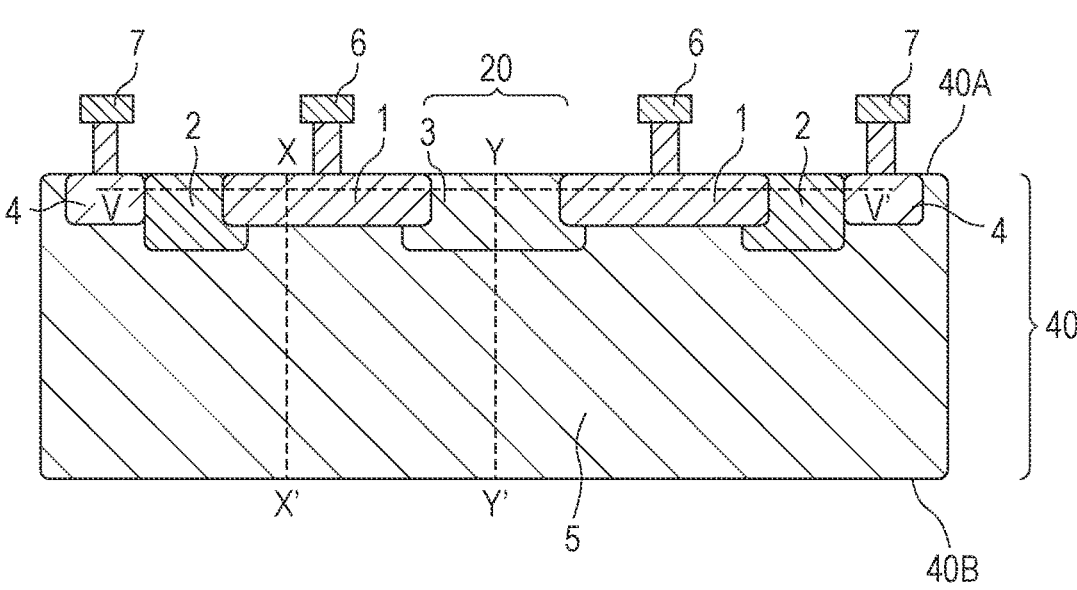
FIG. 4A is a sectional view of the photoelectric conversion apparatus of the first embodiment.
Figure 4B:
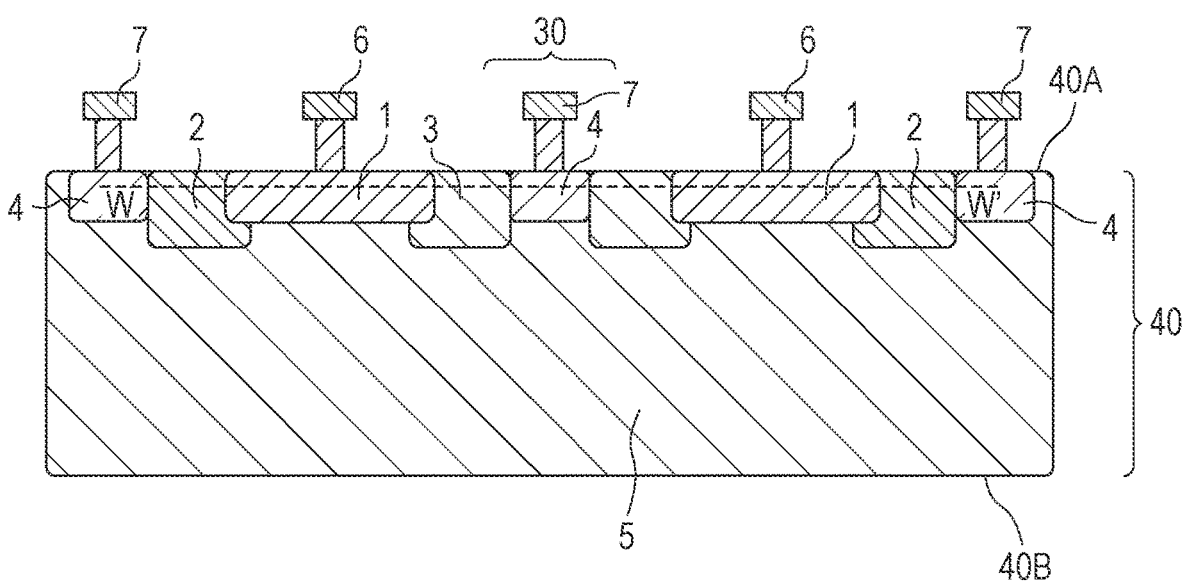
FIG. 4B is a sectional view of the photoelectric conversion apparatus of the first embodiment.
Figure 5A:
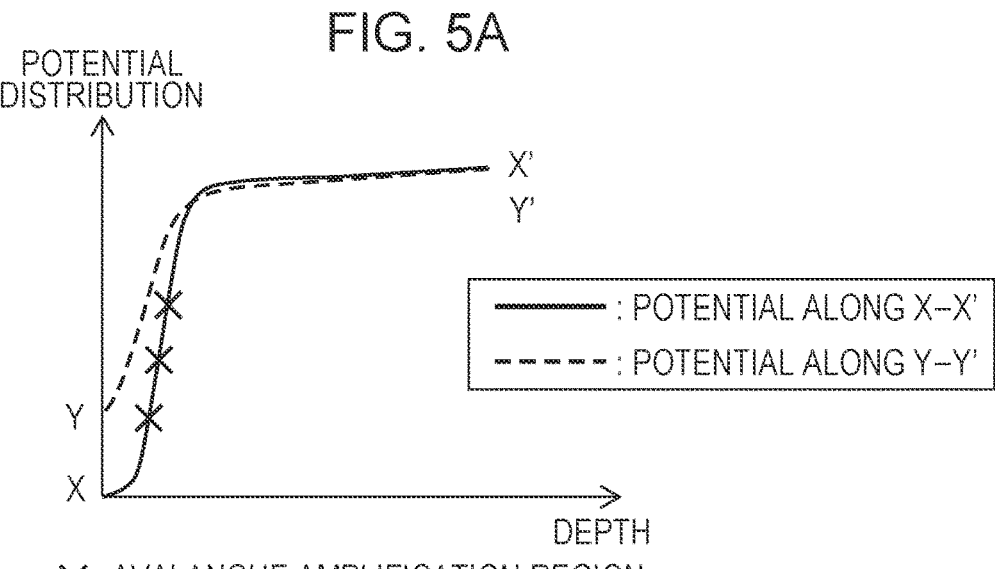
FIG. 5A is a potential map of the photoelectric conversion apparatus of the first embodiment.
Figure 5B:
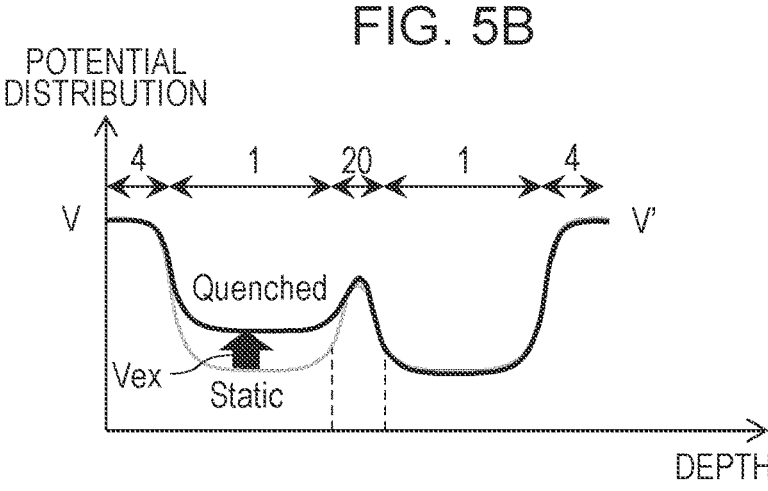
FIG. 5B is a potential map of the photoelectric conversion apparatus of the first embodiment.
Figure 5C:
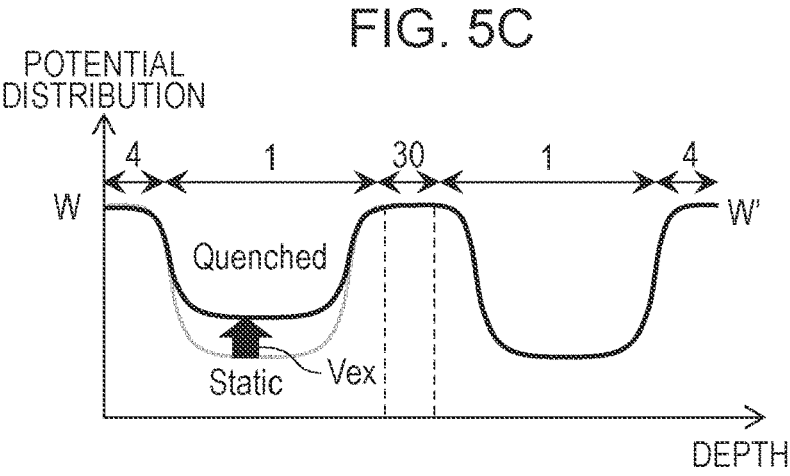
FIG. 5C is a potential map of the photoelectric conversion apparatus of the first embodiment.

FIG. 3 is a partially enlarged plan view of a pixel region of the photoelectric conversion apparatus according to the first embodiment. FIG. 4A is a schematic sectional view taken along IVA-IVA in FIG. 3, and FIG. 4B is a schematic sectional view taken along IVB-IVB in FIG. 3. FIG. 5A is a potential map along X-X' and Y-Y' in FIG. 4A. FIG. 5B is a potential map along V-V' in FIG. 4A. FIG. 5C is a potential map along W-W' in FIG. 4B.

FIG. 3 illustrates four pixels including two pixels in a first direction and two pixels in a second direction orthogonal to the first direction in plan view. It may be mentioned that the first direction refers to a direction along a pixel row (row direction). That is to say, the first direction refers to a direction with a plurality of pixels in a first row corresponding to a direction as viewed from one to the other. In addition, it may be mentioned that the second direction refers to a direction along a pixel column (column direction). A direction intersecting the first direction and the second direction refers to a third direction. Hereinafter, for convenience of the descriptions, in FIG. 3, an avalanche diode in the first row and the first column is referred to as a first avalanche diode, an avalanche diode in the first row and the second column is referred to as a second avalanche diode, and an avalanche diode in the second row and the second column is referred to as a third avalanche diode. According to the present embodiment, a pixel is constituted by a counter and a sensitivity region for generating a signal to be read from the single counter. In the present specification, "plan view" refers to a view in a direction perpendicular to a plane parallel to a light incident surface of the substrate.

As illustrated in FIGS. 4A and 4B, the avalanche diodes are formed inside a substrate 40. The substrate 40 has a first surface 40A and a second surface 40B opposite the first surface 40A. The first surface 40A is a surface on a side on which contact plugs 6 and 7 are formed. In addition, a gate electrode of the transistor may be arranged on the first surface 40A side. Descriptions will be provided while it is assumed that light is incident from the second surface 40B side of the substrate 40, but light may be incident from the first surface 40A side of the substrate 40. In the present specification, "depth" refers to a depth from the first surface 40A toward the second surface 40B.

Each of the avalanche diodes has at least a semiconductor region of a first conductive type (N-type semiconductor region 1) which is formed at a first depth and a semiconductor region of a second conductive type (P-type semiconductor region 5) which is formed at a second depth having a depth from the first surface deeper than the first depth. The N-type semiconductor region 1 and the P-type semiconductor region 5 (seventh semiconductor region) form a P-N junction. The P-type semiconductor region 5 is, for example, a well region.

The contact plug 6 that supplies the potential VH via the quench element 202 is connected to the N-type semiconductor region 1. The contact plug 7 that supplies the potential VL is connected to a P-type semiconductor region 4. The potential VL is supplied to the P-type semiconductor region 5 via the contact plug 7 and the P-type semiconductor region 4.

In a cross section passing through the plurality of N-type semiconductor regions 1, a first isolation portion 20 is arranged between the N-type semiconductor region 1 and the N-type semiconductor region 1. In addition, in a cross section different from the above-described certain cross section, a second isolation portion 30 is arranged between the N-type semiconductor region 1 and the N-type semiconductor region 1. For example, in FIG. 3 and FIGS. 4A and 4B, in a cross section passing through the N-type semiconductor region 1 of the first avalanche diode and the N-type semiconductor region 1 of the second avalanche diode, the first isolation portion 20 is arranged between each of the N-type semiconductor regions. In a cross section passing through the N-type semiconductor region 1 of the second avalanche diode and the N-type semiconductor region 1 of the third avalanche diode, the first isolation portion 20 is arranged between each of the N-type semiconductor regions 1. In a cross section passing through the N-type semiconductor region 1 of the first avalanche diode and the N-type semiconductor region 1 of the third avalanche diode, the second isolation portion 30 is arranged between each of the N-type semiconductor regions 1. The second isolation portion 30 includes at least the P-type semiconductor region 4.

As illustrated in FIG. 5A, a difference between a height of a potential with respect to an electron in an N-type semiconductor region 3 and a height of a potential with respect to an electron in the P-type semiconductor region 5 is smaller than a difference between a height of a potential with respect to an electron in the N-type semiconductor region 1 and a height of a potential with respect to an electron in the P-type semiconductor region 5. The difference between the height of the potential with respect to the electron in the N-type semiconductor region 1 and the height of the potential with respect to the electron in the P-type semiconductor region 5 along X-X' is configured to enable the avalanche multiplication. The difference between the height of the potential with respect to the electron in the first isolation portion 20 and the height of the potential with respect to the electron in the P-type semiconductor region 5 along Y-Y' is configured not to cause the avalanche multiplication. A maximum height of the potential with respect to the electron along Y-Y' is lower than a maximum height of the potential with respect to the electron along X-X'.

FIG. 5B and FIG. 5C illustrate a potential distribution with respect to signal charge along V-V' and a potential distribution with respect to signal charge along W-W'. According to the present embodiment, in a state (Static) where a potential of the avalanche diode is stabilized to wait for a photon, the potential height of the N-type semiconductor region 1 with respect to the signal charge is in the lowest state. Then, when a state (Quenched) is established where a photon or dark charge is detected and the avalanche multiplication is caused in the avalanche diode, the potential height with respect to the signal charge in the N-type semiconductor region 1 is gradually increased. A height of a potential barrier in the first isolation portion 20 is preferably higher than the height of the potential with respect to the signal charge in the N-type semiconductor region 1 when the avalanche multiplication is caused. This is because in this manner, crosstalk of the charge between the adjacent avalanche diodes can be lowered, and it is facilitated to function as an isolation portion. It is noted that in a case where a resolution of the photoelectric conversion apparatus does not need to be increased, it may be possible that the potential barrier is not formed in the first separation portion 20. That is to say, the height of the potential of the first isolation portion 20 may be substantially the same as the height of the potential of the N-type semiconductor region 1 in a state where the avalanche multiplication is to be caused.

According to the present embodiment, the potential barrier formed by the first isolation portion 20 is lower than the potential barrier formed by the second isolation portion 30. In this case too, decrease in pixel size facilitates lower crosstalk. A reason therefor will be described below while the light detection apparatus described in PTL 1 is compared with a comparative example illustrated in FIGS. 6A and 6B.

Figure 6A:
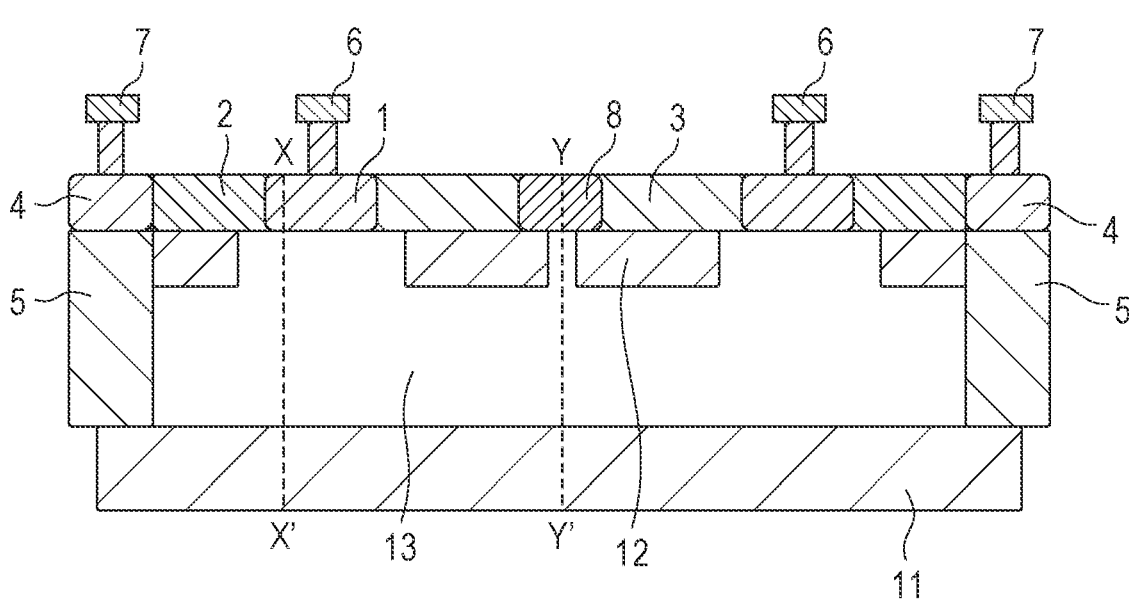
FIG. 6A is a sectional view of a photoelectric conversion apparatus of a comparative example.

In the comparative example illustrated in FIG. 6A, the N-type semiconductor region 3 is arranged between the N-type semiconductor region 1 and the N-type semiconductor region 1. Then, the N-type semiconductor regions 3 are arranged to sandwich a P-type semiconductor region 8.

In the light detection apparatus described in PTL 1, a P-type semiconductor region with a high impurity concentration is arranged so as to surround the entire circumference of the N-type semiconductor region constituting the avalanche diode in plan view. In this case, each of the semiconductor regions needs to be arranged at a predetermined distance to ensure a withstand voltage between the N-type semiconductor region and the P-type semiconductor region. Therefore, the N-type semiconductor regions of each of the avalanche diodes cannot be close to each other, and a pixel pitch cannot be reduced.

Figure 6B:
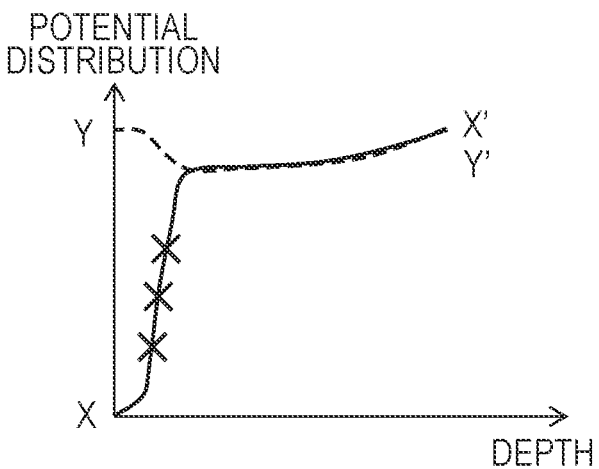
FIG. 6B is a potential map of the photoelectric conversion apparatus of the comparative example.

In addition, in the photoelectric conversion apparatus illustrated in the comparative example, the impurity concentration of the P-type semiconductor region 8 is low, but the P-type semiconductor region remains as a neutral region. Therefore, as illustrated in FIG. 6B, along Y-Y', the potential with respect to the signal charge is increased as approaching Y. In this structure, an electron generated in a region between the P-type semiconductor region 8 and a P-type semiconductor region 11 is also read as signal charge. That is to say, a sensitivity region cannot be separated for each of the N-type semiconductor regions 1 in a semiconductor region 13 between the P-type semiconductor region 8 and the P-type semiconductor region 11.

It is noted that when simply used in the present specification, the term "impurity concentration" means a net impurity concentration compensated by impurity of a reverse conductivity-type impurity. That is to say, "impurity concentration" refers to a NET concentration. A region with a P-type additive impurity concentration higher than an N-type additive impurity concentration is a P-type semiconductor region. Conversely, a region with an N-type additive impurity concentration higher than a P-type additive impurity concentration is an N-type semiconductor region.

According to the present embodiment, such a semiconductor region in which a region between the N-type semiconductor regions 1 is depleted is arranged as the first isolation portion 20 between the plurality of N-type semiconductor regions 1. Since the first isolation portion 20 is depleted, as illustrated in FIG. 5A, the potential distribution along Y-Y' decreases from the P-type semiconductor region 5 toward the first isolation portion 20. In other words, the potential distribution along Y-Y' monotonically decreases from the P-type semiconductor region 5 toward the first isolation portion 20. Therefore, a state where charge also flows to the first isolation portion 20 is established. The charge having flowed to the first isolation portion 20 flows through the N-type semiconductor region 1, but since a potential difference between the N-type semiconductor region 1 and the isolation portion 20 is a potential difference to such an extent that no avalanche multiplication is caused, the avalanche current is not generated and is not counted by the counter circuit. Therefore, the potential difference is not read as a signal. That is to say, not only the first isolation portion 20 but also a region between the first isolation portion 20 and a second surface substantially function as dead regions and can be caused to function as the isolation portion. Therefore, even when the pixel pitch is decreased, the signal can be read for each pixel while the crosstalk is lowered.

According to the present embodiment, the N-type semiconductor region 3 with the impurity concentration lower than that of the N-type semiconductor region 1 is arranged as the first isolation portion 20. In other words, a configuration is adopted where instead of surrounding the entire circumference of the N-type semiconductor region 1 in plan view by the P-type semiconductor region 4, the P-type semiconductor region 4 is arranged in a part of the circumference of the N-type semiconductor region 1, and the P-type semiconductor region 4 is not arranged in another part. That is to say, a configuration is adopted where the P-type semiconductor region 4 in which the withstand voltage needs to be ensured is only partially arranged, and in the other part, a height of the potential barrier is set to such an extent that the signal charge does not leak. Without being limited to this, as long as the first isolation portion 20 is depleted, the P-type semiconductor region 4 and the N-type semiconductor regions 3 arranged to sandwich the P-type semiconductor region 4 may be arranged as the first isolation portion 20 as in an embodiment which will be described below. In addition, an intrinsic semiconductor region (i-type semiconductor region) may be arranged in at least a part thereof. Furthermore, only the P-type semiconductor region 4 may be arranged between the N-type semiconductor regions 1.

A length of the first isolation portion 20 in the first direction is shorter than a length of the second isolation portion 30 in the third direction. In other words, a distance between the N-type semiconductor regions 1 in the first direction is shorter than a distance between the N-type semiconductor regions 1 in the third direction. For example, a ratio of a length of the first isolation portion 20 to a length of the second isolation portion 30 is less than 1 and equal to or more than ⅛. For example, a distance between avalanche multiplication portions in the first direction is preferably 1 μm or more. To ensure the withstand voltage, the distance between the avalanche multiplication portions in the first direction can be set at 0.5 μm or more, for example, and is preferably set at 1 μm or more. On the other hand, to reduce the area of the pixel region, the distance between the avalanche multiplication portions in the first direction can be set at 10 μm or less, for example, and is preferably set at 4 μm or less.

The impurity concentration of the N-type semiconductor region 3 is preferably lower than the impurity concentration of the P-type semiconductor region 5 arranged at a position overlapped with the N-type semiconductor region 3 in plan view. In this manner, the N-type semiconductor region 3 can be depleted in a lengthwise direction toward the second surface. For example, the impurity concentration of the N-type semiconductor region 3 differs by two times or more relative to the impurity concentration of the P-type semiconductor region 5. The impurity concentration of the N-type semiconductor region 3 is set, for example, at 1E18 cm$^{-3}$ or less. The N-type semiconductor region 3 preferably satisfies the following expression (1). In the following expression (1), the impurity concentration of the N-type semiconductor region 3 is set as an impurity concentration Nd2, the impurity concentration of the P-type semiconductor region 5 is set as Na2, and an elementary electric charge is set as q. Furthermore, a dielectric constant of a semiconductor is set as ε, a potential difference between the P-N junction of the N-type semiconductor region 3 and the P-type semiconductor region 5 is set as a potential difference V, and a depth of the N-type semiconductor region 3 is set as H. Herein, the depth refers to a thickness of the N-type semiconductor region 3 in a direction from the first surface toward the second surface.

[Math. 2]

$$\sqrt{\frac{\varepsilon N_{a2} V}{q N_{d2}(N_{a2} + N_{d2})}} > H \qquad (1)$$

The N-type semiconductor region 3 is shared by the plurality of adjacent avalanche diodes. The second isolation portion 30 is constituted by the N-type semiconductor region 3 and the P-type semiconductor region 4.

An N-type semiconductor region 2 with the impurity concentration lower than that of the N-type semiconductor region 1 is preferably arranged between the N-type semiconductor region 1 and the P-type semiconductor region 4. In this manner, it can be facilitated to move charge in the vicinity of the N-type semiconductor region 2 to a position close to the contact plug 6 in the N-type semiconductor region 1. The N-type semiconductor region 2 can be set to have the same impurity concentration as the N-type semiconductor region 3.

In FIGS. 4A and 4B, the N-type semiconductor region 2 and the P-type semiconductor region 4 are in contact with each other, but the N-type semiconductor region 2 and the P-type semiconductor region 4 may be physically separated from each other. In addition, to improve voltage resistance between the N-type semiconductor region 2 and the P-type semiconductor region 4, trench isolation may be applied between the N-type semiconductor region 2 and the P-type semiconductor region 4. For example, STI (Shallow Trench Isolation) may be applied between the N-type semiconductor region 2 and the P-type semiconductor region 4.

It is noted that FIGS. 4A and 4B illustrate a configuration in which the P-type semiconductor region 5 that does not have an impurity concentration gradient is arranged, but the P-type semiconductor region 5 may be a region having an impurity concentration gradient. For example, a configuration can be adopted where as compared with an impurity concentration at a certain depth, an impurity concentration at a depth deeper than the certain depth is set to be higher.

In this case, an impurity region of the first conductive type or the second conductive type for adjusting an electric field of the P-N junction may be arranged immediately below the N-type semiconductor region 1.

In FIGS. 4A and 4B, the two avalanche diodes aligned in the first direction or the second direction share the semiconductor region 3, but three or more avalanche diodes aligned in the first direction or the second direction may share the N-type semiconductor region 3.

In addition, in FIGS. 4A and 4B, in the third direction, the P-type semiconductor region 4 and the contact plug 7 are arranged between each of the N-type semiconductor regions 1, but the P-type semiconductor region 4 and the contact plug 7 may be thinned out and arranged.

In FIG. 3 and FIGS. 4A and 4B, in plan view, a distance between the four contact plugs 6 is equal to or more than LC, and a distance between the four contact plugs 6 and the contact plug 7 is equal to or less than LC. L denotes a distance between the contact plugs 7 aligned in the first direction, and LC is L/√2. In other words, in FIG. 3 and FIGS. 4A and 4B, the contact plug 7 is arranged at a distance equal to or less than LC with respect to all of the four contact plugs 6. In this manner, while the distance between the N-type semiconductor region 1 of each of the avalanche diodes and the P-type semiconductor region 4 is set at an equal interval, the contact plug 7 can be shared by the avalanche diodes. A distance between contact plugs may be, for example, a distance between contact plugs at the shortest distance. For example, in a case where a plurality of contact plugs are connected to the P-type semiconductor region 4 and the plurality of contact plugs 6 are connected to the N-type semiconductor region 1, it is sufficient when the contact plug 6 and the contact plug 7 at the shortest distance satisfy the above-described expression. The shortest distance between the N-type semiconductor region 1 of each of the avalanche diodes and the contact plug 7 closest to the N-type semiconductor region 1 is preferably set to be an equal interval.

In addition, as illustrated in FIG. 3 and FIGS. 4A and 4B, the contact plug 7, the contact plug 6, the contact plug 7, the contact plug 6, and the contact plug 7 are arranged in the third direction in turn in plan view. Along a cross section in the third direction, the contact plug 7, the P-type semiconductor region 5, the N-type semiconductor region 2, the N-type semiconductor region 1, and the N-type semiconductor region 2 are arranged in turn. Subsequently, furthermore, the contact plug 7, the N-type semiconductor region 3, the N-type semiconductor region 1, the N-type semiconductor region 3, the P-type semiconductor region 5, and the contact plug 7 are arranged in turn. In this manner, according to the present embodiment, while the contact plug 7 is shared by the avalanche diodes, each of the configurations is arranged to be symmetric with each other in the third direction. In this manner, it may be possible to reduce fluctuation of signal readout among the avalanche diodes.

Second Embodiment

Figure 7:
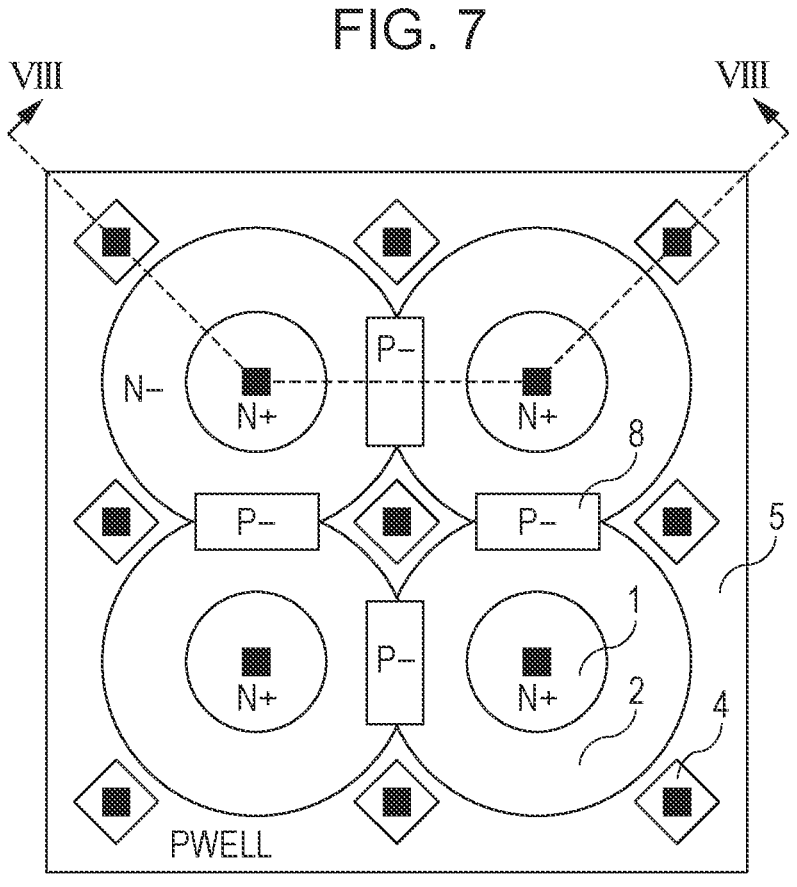
FIG. 7 is a partially enlarged plan view of a photoelectric conversion apparatus of a second embodiment.

A configuration of the photoelectric conversion apparatus according to a second embodiment will be described using FIG. 7 and FIG. 8. The second embodiment is different from the first embodiment in that the first isolation portion 20 is constituted by the N-type semiconductor region 3 and the P-type semiconductor region 8 with the impurity concentration lower than that of the P-type semiconductor region 4. An item other than an item to be described below can substantially adopt a configuration similar to the first embodiment.

According to the present embodiment too, the height of the potential barrier formed by the second isolation portion 30 is higher than the height of the potential barrier formed by the first isolation portion 20. In addition, according to the present embodiment too, the first isolation portion 20 is configured to be completely depleted.

The impurity concentration of the P-type semiconductor region 8 is lower than the impurity concentration of the P-type semiconductor region 4.

A condition in a configuration in which the P-type semiconductor region 8 is to be completed depleted is illustrated in the following expression (2). Herein, the impurity concentration of the N-type semiconductor region 3 is set as Nd, the impurity concentration of the P-type semiconductor region 8 is set as Na, and the elementary electric charge is set as q. Furthermore, the dielectric constant of the semiconductor is set as $\varepsilon$, a potential difference between the P-N junction of the N-type semiconductor region 3 and the P-type semiconductor region 8 is set as V, and a length of the P-type semiconductor region 8 sandwiched by the N-type semiconductor regions 3 is set as D.

[Math. 3]

$$2 \times \sqrt{\frac{2\varepsilon \, NdV}{qNa(Na + Nd)}} > D \tag{2}$$

In the above-described expression (2), a dimension of D is [m], a dimension of q is [C], a dimension of Nd and Na is $[m^{-3}]$, a dimension of $\varepsilon$ is [F/m], and a dimension of V is [V]. That is, when the dimensions of the above-described expression (2) are extracted, the following expression (3) is established.

[Math. 4]

$$\sqrt{\frac{[F/m][m^{-3}][V]}{[C][m^{-3}][m^{-3}]}} = \sqrt{\frac{[F][m^{-4}][V]}{[C][m^{-6}]}} \tag{3}$$

In addition, since [C]=[F][V] because of Q=CV, when the above-described expression (3) is expanded, the following expression (4) is established.

[Math. 5]

$$= \sqrt{\frac{[F][m^{-4}][V]}{[F][V][m^{-6}]}}$$
$$= \sqrt{\frac{1}{[m^{-2}]}} = [m] \tag{4}$$

Figure 8:
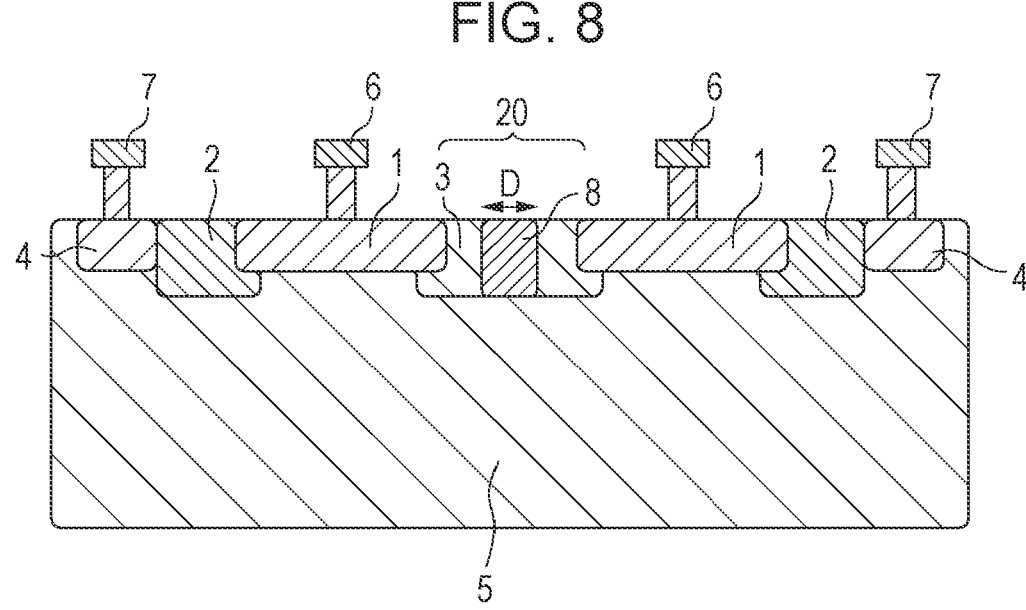
FIG. 8 is a sectional view of the photoelectric conversion apparatus of the second embodiment.

In FIG. 8, the N-type semiconductor region 3 and the P-type semiconductor region 8 are formed at the same depth, but the P-type semiconductor region 8 may be formed at a position shallower than the N-type semiconductor region 3. In addition, the P-type semiconductor region 8 is configured to constitute a part of the first surface 40A, but may be formed to be away from the first surface 40A.

In FIG. 8, the P-type semiconductor region 8 does not have a gradient of the impurity concentration, but may have a gradient of the impurity concentration in at least one of a direction parallel to the first surface 40A and a depth direction.

According to the present embodiment too, similarly as in the first embodiment, the pixel pitch can be reduced as compared with PTL 1. In addition, since it is possible to set that the charge generated in the region between the first isolation portion 20 and the second surface is not to be read as the signal, the sensitivity region can be divided for each of the N-type semiconductor regions 1, and the signals can be separated.

Third Embodiment

A configuration of the photoelectric conversion apparatus according to a third embodiment will be described using FIG. 9 to FIG. 11. The third embodiment is different from the first embodiment in that the first isolation portion 20 is constituted by the N-type semiconductor region 3 and a trench isolation portion 9. An item other than an item to be described below can substantially adopt a configuration similar to the first embodiment.

Figure 9:
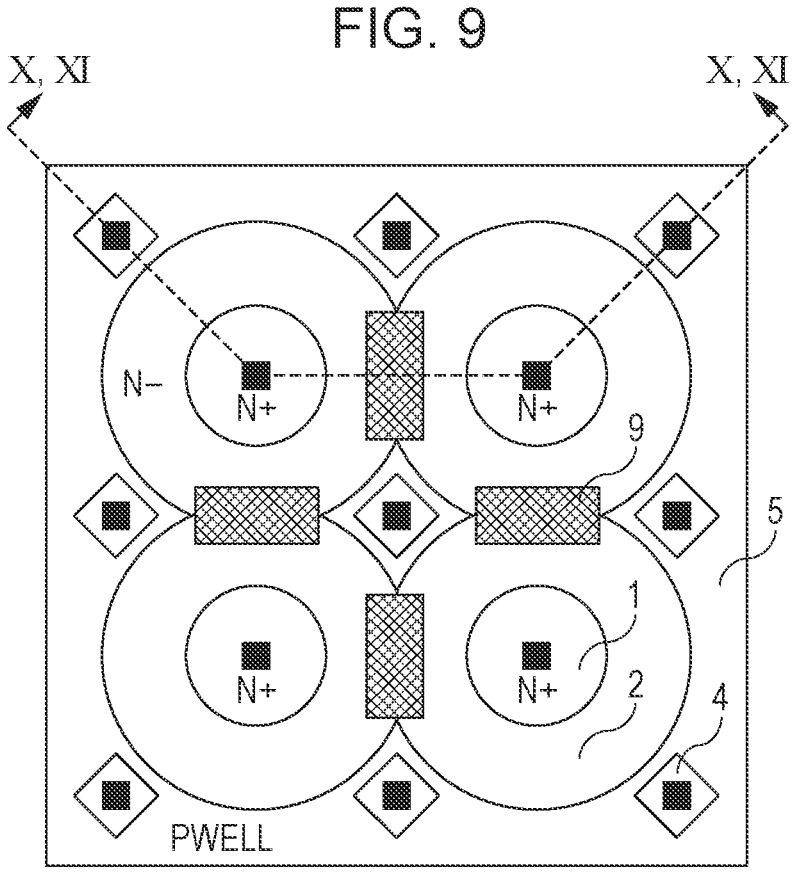
FIG. 9 is a partially enlarged plan view of a photoelectric conversion apparatus of a third embodiment.

FIG. 9 is a partially enlarged plan view of the pixel region of the photoelectric conversion apparatus according to the third embodiment. FIG. 10 and FIG. 11 are schematic sectional views taken along X-X and XI-XI in FIG. 9.

Figure 10:
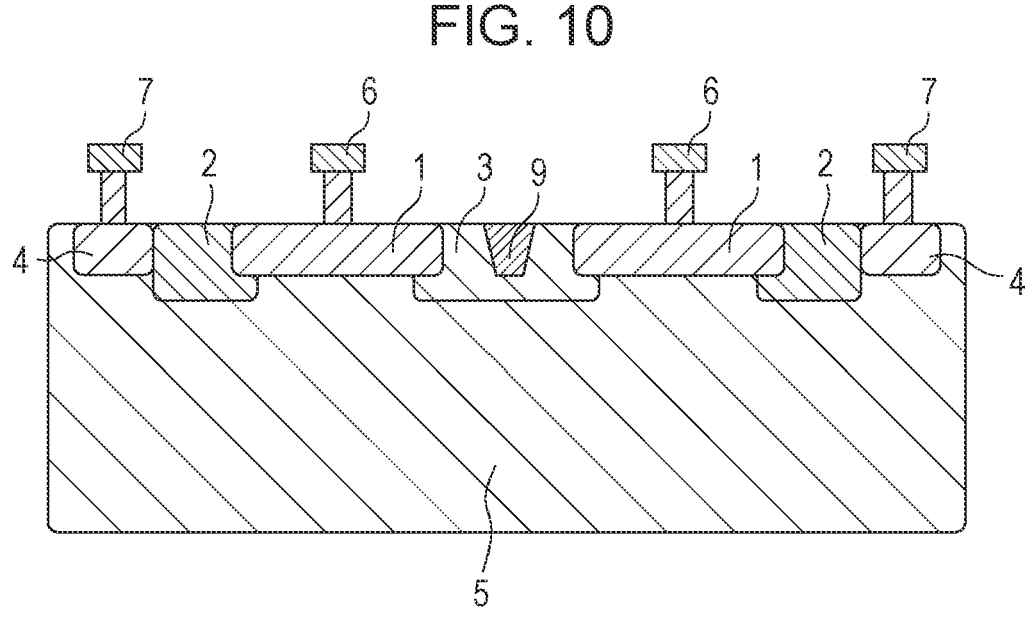
FIG. 10 is a sectional view of the photoelectric conversion apparatus of the third embodiment.
Figure 11:
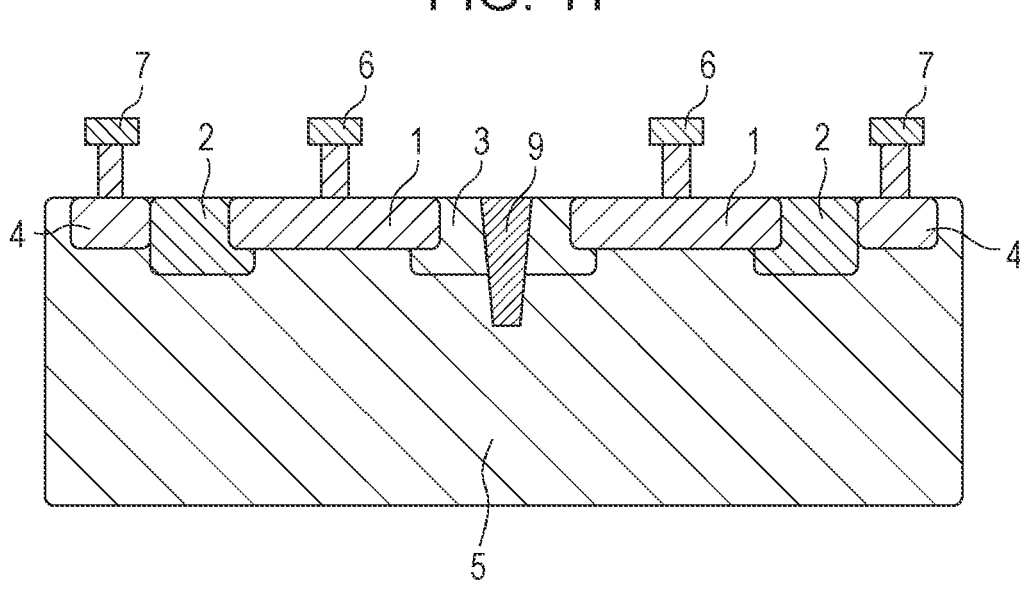
FIG. 11 is a modified example of the third embodiment.

The trench isolation portion 9 can be formed by STI as illustrated in FIG. 10 or DTI (Deep Trench Isolation) as illustrated in FIG. 11. For example, one end of the trench isolation portion 9 is formed up to a position deeper than the N-type semiconductor region 1.

At least one of a dielectric material formed of an oxide, polysilicon arranged via a dielectric film, and metal is embedded in the trench isolation portion 9.

An impurity region of the first conductive type for inactivating a defect that may be formed on an interface between the trench isolation portion 9 and the semiconductor region 3 may be arranged on a lateral side of the trench isolation portion 9.

In addition, in the case of a backside illumination type sensor, the trench may be formed from the second surface side.

According to the present embodiment too, similarly as in the first embodiment, the pixel pitch can be reduced as compared with PTL 1. In addition, in a case where the trench isolation portion 9 is formed by DTI, color mixture between adjacent pixels due to an influence of light emission in the avalanche diode can be reduced.

Fourth Embodiment

Figure 12:
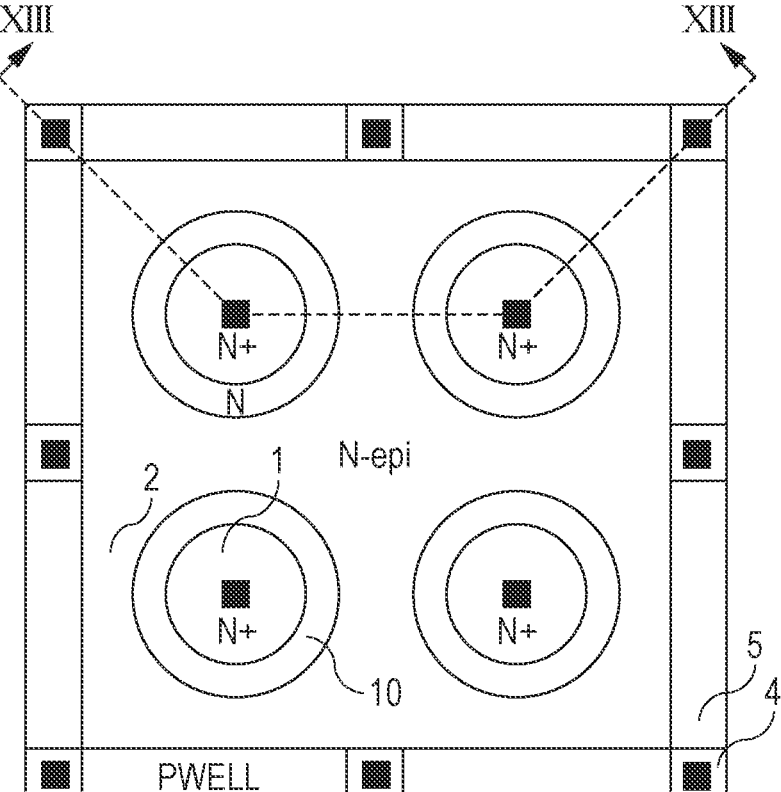
FIG. 12 is a partially enlarged plan view of a photoelectric conversion apparatus of a fourth embodiment.
Figure 13:
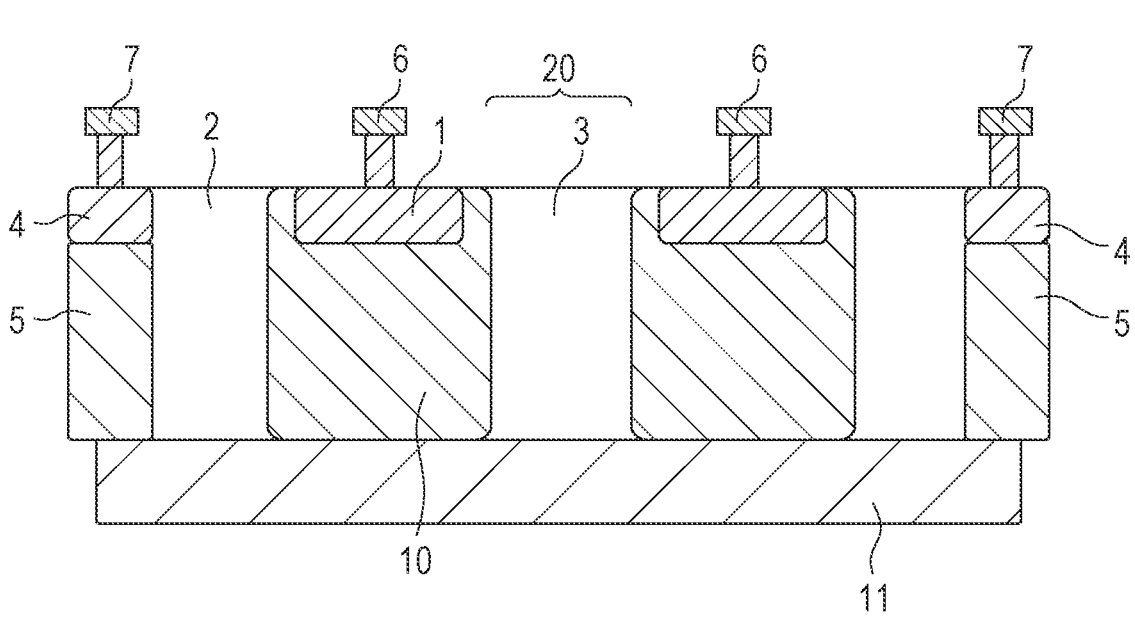
FIG. 13 is a sectional view of the photoelectric conversion apparatus of the fourth embodiment.

A configuration of the photoelectric conversion apparatus according to a fourth embodiment will be described using FIG. 12 and FIG. 13. According to the fourth embodiment, the avalanche diode is constituted by the N-type semiconductor region 1, an N-type semiconductor region 10, and the P-type semiconductor region 11. The P-type semiconductor region 11 is also provided at a position deeper than the N-type semiconductor regions 2 and 3 and the P-type semiconductor region 5. Then, the P-type semiconductor region 4 and the P-type semiconductor region 11 are linked to each other via the P-type semiconductor region 5. Configurations other than these are similar to the first embodiment. An item other than an item to be described below can substantially adopt a configuration similar to the first embodiment.

The N-type semiconductor region 10 is a semiconductor region with the impurity concentration lower than that of the N-type semiconductor region 1. In addition, the N-type semiconductor region 10 is a semiconductor region with the impurity concentration higher than that of the N-type semiconductor region 3. When the N-type semiconductor region 10 is formed between the N-type semiconductor region 1 and the P-type semiconductor region 11, an electric field intensity generated between the N-type semiconductor region 1 and the P-type semiconductor region 11 can be adjusted. In addition, since the N-type semiconductor region 10 is arranged, it is facilitated to detect photoelectric charge generated at a deep portion as compared with the first embodiment, and a long wavelength sensitivity can be improved.

The P-type semiconductor region 11 is continuously arranged from a position below one of the contact plugs 7 up to a position below the other one of the contact plugs 7 in a certain cross section. Since the P-type semiconductor region 11 is arranged, it is possible to prevent the unnecessary signal charge that may be generated on the second surface 40B of the substrate to be read to the N-type semiconductor region 1. In FIG. 12, two sets of four avalanche diodes are arranged in partitioned regions which are partitioned by the P-type semiconductor regions 4, 5, and 11.

The P-type semiconductor region 5 can supply the potential to the P-type semiconductor region 11 via the P-type semiconductor region 4. The P-type semiconductor region 5 is a semiconductor region with the impurity concentration lower than that of the P-type semiconductor region 4.

The P-type semiconductor region 11 may have a concentration gradient in the depth direction. In addition, in FIG. 12, a trench isolation portion for ensuring the withstand voltage may be arranged between the P-type semiconductor region 4 and the N-type semiconductor region 2.

According to the present embodiment too, similarly as in the first embodiment, the pixel pitch can be reduced as compared with PTL 1. In addition, it is facilitated to detect the photoelectric charge generated at the deep portion as compared with the first embodiment, and the long wavelength sensitivity can be improved.

Fifth Embodiment

Figure 14:
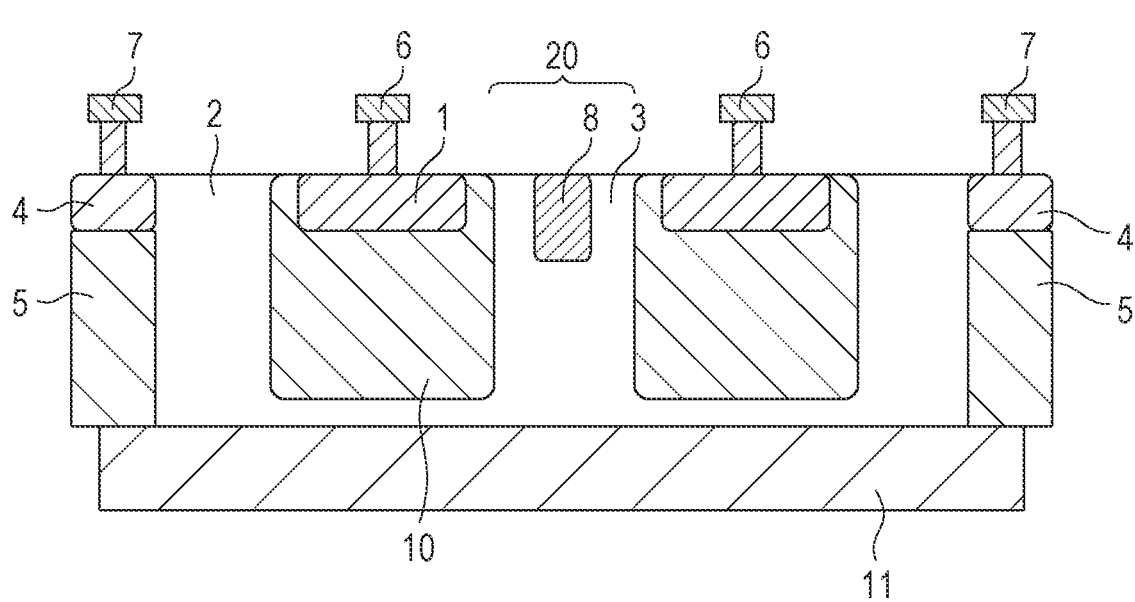
FIG. 14 is a sectional view of a photoelectric conversion apparatus of a fifth embodiment.

A configuration of the photoelectric conversion apparatus according to a fifth embodiment will be described using FIG. 14. According to the fifth embodiment, a second isolation portion 20 is constituted by the N-type semiconductor region 3 and the P-type semiconductor region 8. Since the P-type semiconductor region 8 is similar to the P-type semiconductor region 8 of the second embodiment, descriptions thereof will be omitted. In addition, since configurations other than the second isolation portion 20 are as described according to the fourth embodiment, descriptions thereof will be omitted.

According to the present embodiment too, similarly as in the first embodiment, the pixel pitch can be reduced as compared with PTL 1. In addition, it is facilitated to detect the photoelectric charge generated at the deep portion as compared with the first embodiment, and the long wavelength sensitivity can be improved.

Sixth Embodiment

Figure 15:
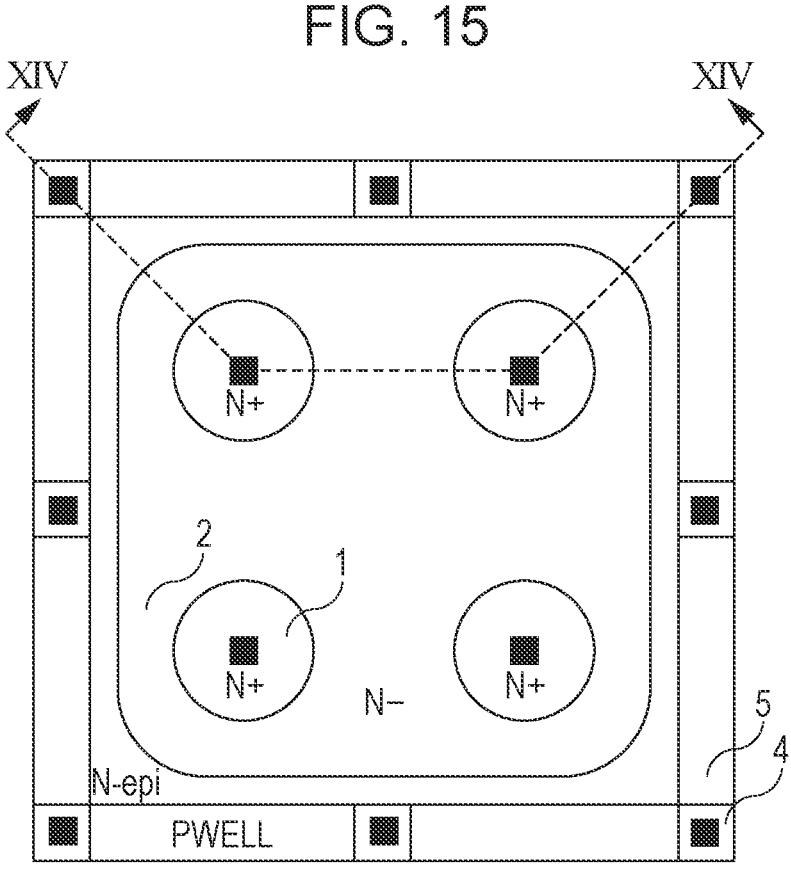
FIG. 15 is a partially enlarged plan view of a photoelectric conversion apparatus of a sixth embodiment.
Figure 16:
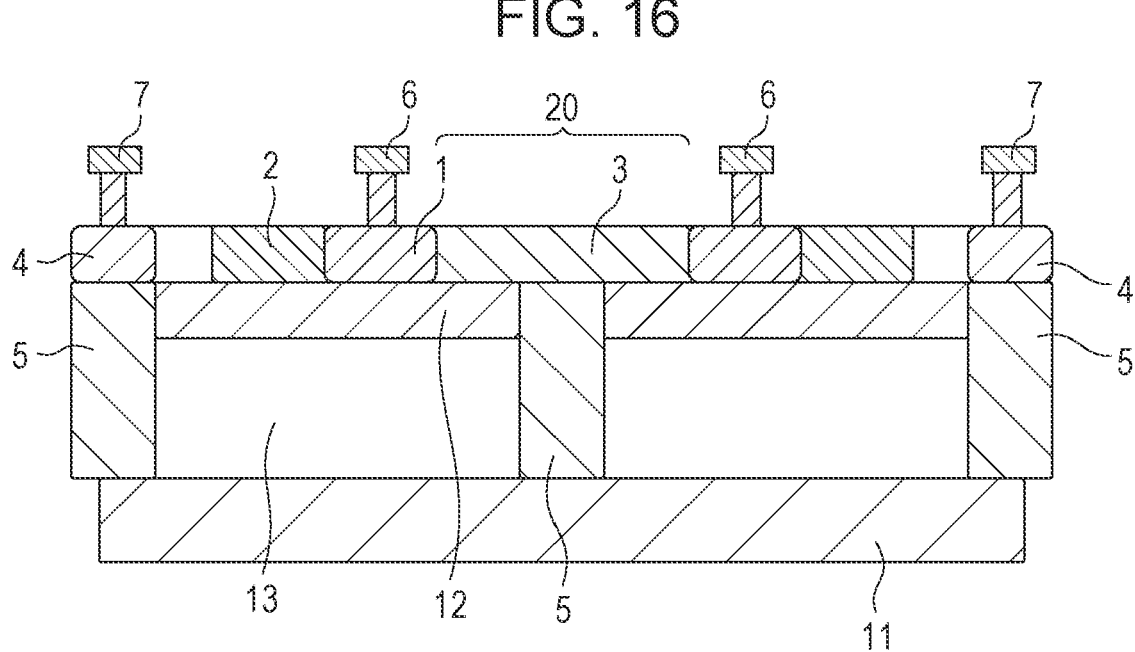
FIG. 16 is a partially enlarged plan view of the photoelectric conversion apparatus of the sixth embodiment.

A configuration of the photoelectric conversion apparatus according to a sixth embodiment will be described using FIG. 15 and FIG. 16. FIG. 15 is a partially enlarged plan view of the pixel region of the photoelectric conversion apparatus according to the sixth embodiment. FIG. 16 is a schematic sectional view taken along XIV-XIV in FIG. 15. According to the sixth embodiment, a P-type semiconductor region for physically separating the sensitivity region of each of the pixels is arranged. In addition, a P-type semiconductor region 12 is arranged between the N-type semiconductor region 1 and the P-type semiconductor region 11, and the photoelectric conversion region 13 is arranged between the P-type semiconductor region 12 and the P-type semiconductor region 11. Then, the P-type semiconductor region 5 is arranged between the first isolation portion 20 and the P-type semiconductor region 11. Configurations other than these are similar to the fourth embodiment. An item other than an item to be described below can substantially adopt a configuration similar to the fourth embodiment.

The P-type semiconductor region 12 forms the P-N junction with the N-type semiconductor region 1. The avalanche multiplication may be caused in the vicinity of this P-N junction. The P-type semiconductor region 12 is continuously arranged from one of the P-type semiconductor regions 5 up to the other one of the P-type semiconductor regions 5 in sectional view.

The photoelectric conversion region 13 is arranged between the P-type semiconductor region 12 and the P-type semiconductor region 11.

The photoelectric conversion region 13 is constituted by an N-type semiconductor region with the impurity concentration lower than that of the N-type semiconductor region 1 or a P-type semiconductor region with the impurity concentration lower than that of the P-type semiconductor regions 5 and 11.

In FIG. 15, the P-type semiconductor region 4 and the N-type semiconductor region 2 are separated from each other, but the P-type semiconductor region 4 and the N-type semiconductor region 2 may be in contact with each other.

According to the present embodiment too, similarly as in the first embodiment, the pixel pitch can be reduced as compared with PTL 1. In addition, according to the present embodiment, since the photoelectric conversion region is physically separated by the P-type semiconductor region 5, it is facilitated to lower the crosstalk of the charge. Furthermore, since an avalanche multiplication region can be reduced as compared with the first embodiment, the dark current can be reduced while the sensitivity is maintained.

Seventh Embodiment

Figure 17:
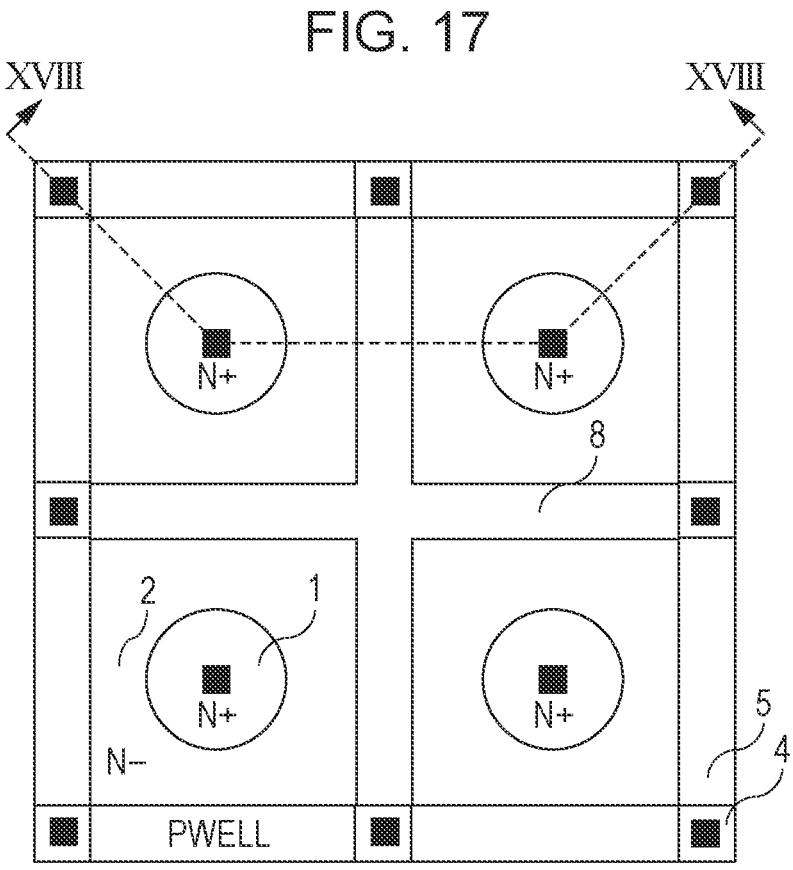
FIG. 17 is a partially enlarged plan view of a photoelectric conversion apparatus of a seventh embodiment.
Figure 18:
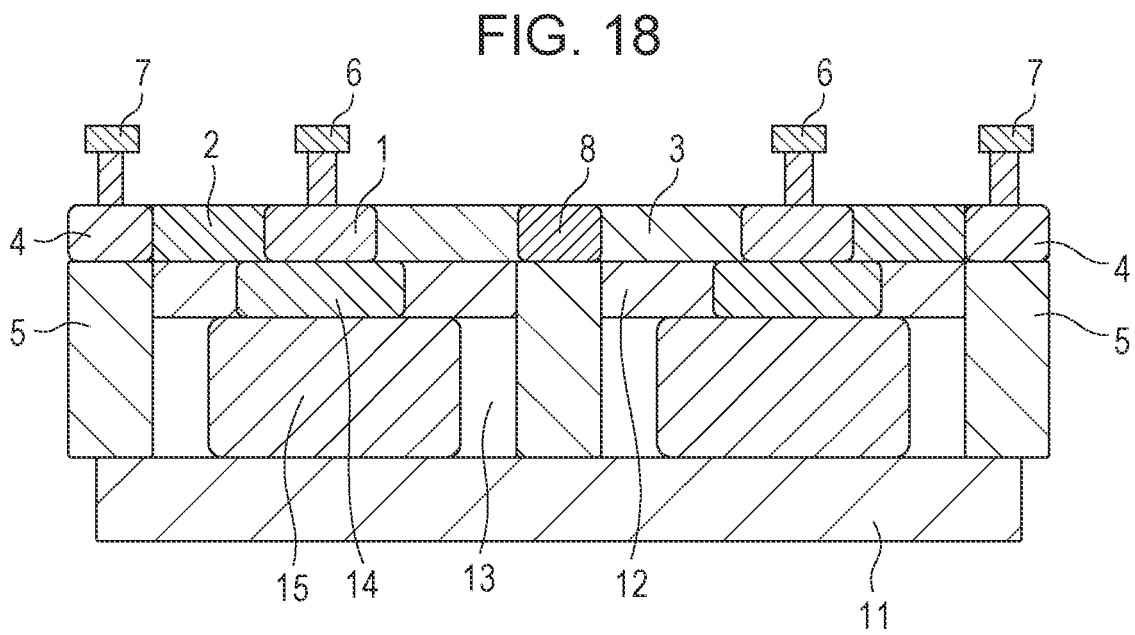
FIG. 18 is a sectional view of the photoelectric conversion apparatus of the seventh embodiment.

A configuration of the photoelectric conversion apparatus according to a seventh embodiment will be described using FIG. 17 and FIG. 18. FIG. 17 is a partially enlarged plan view of the pixel region of the photoelectric conversion apparatus according to the seventh embodiment. FIG. 18 is a schematic sectional view taken along XVIII-XVIII in FIG. 17. According to the seventh embodiment, the first isolation portion 20 is constituted by the N-type semiconductor region 3 and the P-type semiconductor region 8. In addition, a P-type semiconductor region 14 is arranged between the P-type semiconductor regions 12 in a direction parallel to the first surface, and an N-type semiconductor region 15 is arranged between the photoelectric conversion regions. Configurations other than these are similar to the sixth embodiment. An item other than an item to be described below is substantially similar to the sixth embodiment.

In plan view, the P-type semiconductor region 14 is surrounded by the P-type semiconductor region 12. The P-type semiconductor region 14 is a P-type semiconductor region with the impurity concentration lower than that of the P-type semiconductor region 12. The P-type semiconductor region 14 and the N-type semiconductor region 1 form the P-N junction, and the signal charge is subjected to the avalanche multiplication in the vicinity of the P-N junction. The P-type semiconductor region 14 has the lower height of the potential with respect to the electron as compared with the P-type semiconductor region 12. Therefore, the generated signal charge is easily collected in the P-type semiconductor region 14, and easily passes through a P-N junction interface between the P-type semiconductor region 14 and the N-type semiconductor region 1.

The N-type semiconductor region 15 is arranged between the P-type semiconductor region 14 and the P-type semiconductor region 11. The N-type semiconductor region 15 has the impurity concentration lower than that of the semiconductor region 1. In a case where the semiconductor region 14 is an N-type semiconductor region, the impurity concentration lower than that of the semiconductor region 14 is set.

According to the present embodiment too, similarly as in the first embodiment, the pixel pitch can be reduced as compared with PTL 1. In addition, similarly as in the sixth embodiment, the crosstalk of the charge can be suppressed. In addition, it is facilitated to collect the charge in the N-type semiconductor region 1.

Eighth Embodiment

The photoelectric conversion apparatus according to an eighth embodiment will be described using FIG. 19. In the photoelectric conversion apparatus according to the present embodiment, a substrate on which the avalanche diode 201 of the pixels 110 of FIG. 2 is arranged and a substrate on which and the counter circuit 204 and the quench element 202 are arranged are separated from each other. Then, the photoelectric conversion apparatus is constituted by layering and joining the substrates.

According to the present embodiment, each of micro lenses is arranged so as to be overlapped with each of the avalanche diodes in plan view.

Figure 19:
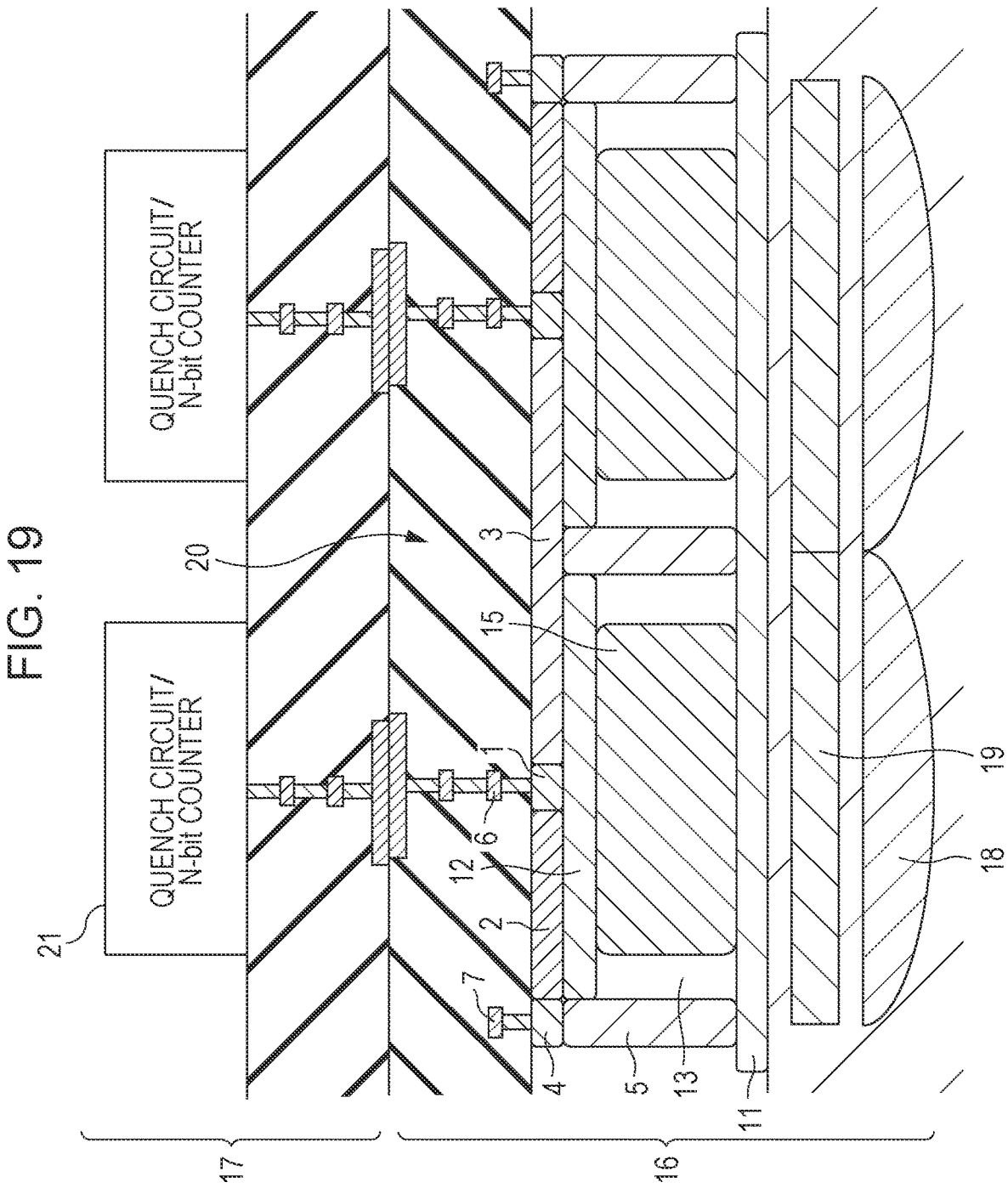
FIG. 19 is a sectional view of a photoelectric conversion apparatus of an eighth embodiment.

FIG. 19 illustrates a state where light is incident from the side of the second surface corresponding to a surface on a side on which the contact plug is not connected. Therefore, a micro lens 18 and a color filter 19 are arranged on the side of the second surface of a substrate 16. In a case where light is caused to be incident from the side of the first surface of the substrate 16, the micro lens 18 and the color filter 19 are arranged on the side of the first surface.

According to the present embodiment too, similarly as in the first embodiment, the pixel pitch can be reduced as compared with PTL 1. In addition, by arranging a circuit section on a side of a substrate 17, the area of the substrate 16 can be reduced.

In FIG. 19, configurations other than the above-described configurations adopt the configurations of the avalanche diode described according to the seventh embodiment. It is noted that the configurations of the avalanche diode described according to the first to sixth embodiments may be adopted. In this case, similarly as in FIG. 19, the contact plug 6 is connected to the N-type semiconductor region 1 described in each of the embodiments.

Ninth Embodiment

Figure 20:
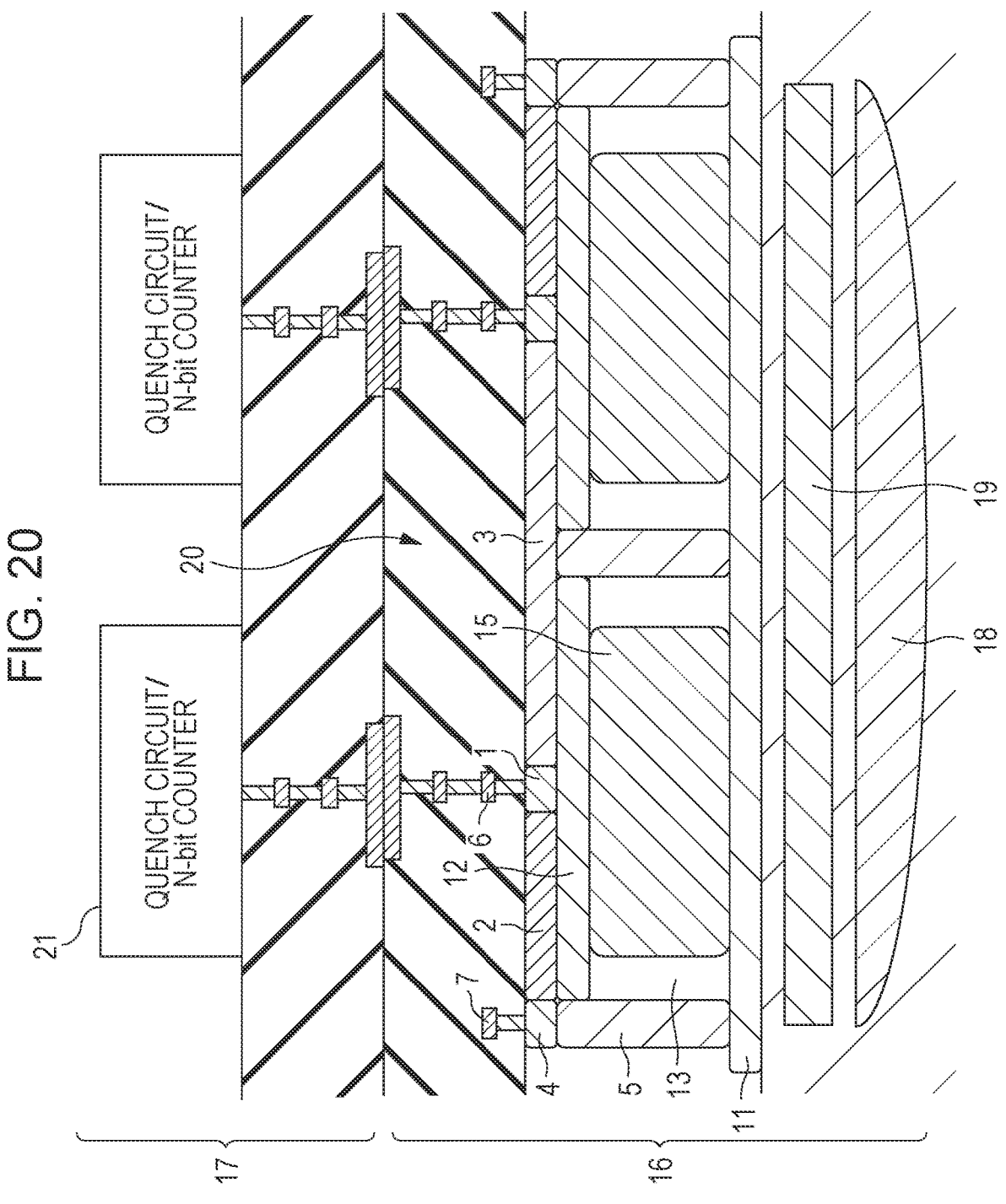
FIG. 20 is a sectional view of a photoelectric conversion apparatus of a ninth embodiment.

The photoelectric conversion apparatus of a ninth embodiment will be described using FIG. 20. The photoelectric conversion apparatus according to the present embodiment is configured such that light that has passed through the single micro lens is incident on the plurality of avalanche diodes. Configurations other than this are similar to the seventh embodiment.

According to the present embodiment, while the pixel pitch is reduced, depth detection can be performed.

Tenth Embodiment

An example of a photoelectric conversion system using the photoelectric conversion apparatus of each of the embodiments will be described using FIG. 21. An invisible light detection system corresponding to an example of a light detection system and a medical diagnosis system such as PET will be described using FIG. 21. A part having a function similar to FIG. 1 to FIG. 20 is assigned with a similar reference sign, and detailed descriptions thereof will be omitted. It is noted that a pixel of the present embodiment has a TDC and a memory instead of the counter circuit of FIG. 2. Herein, descriptions will be provided where the TDC is set as the TDC 204, and the memory is set as the memory 205.

Figure 21:
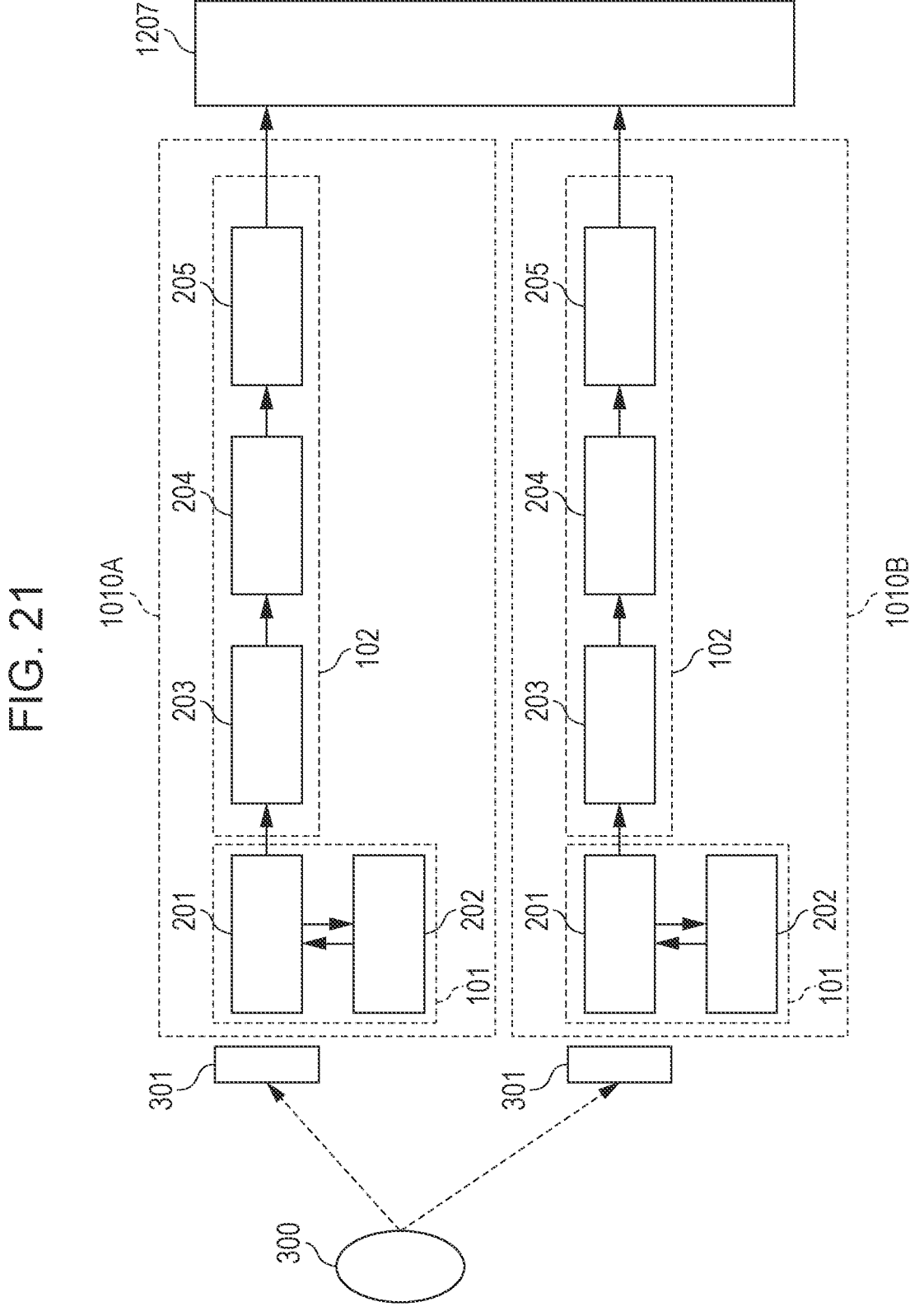
FIG. 21 is a photoelectric conversion system according to a tenth embodiment.

FIG. 21 is a block diagram for describing a configuration of the invisible light detection system. The invisible light detection system has a wavelength conversion section 301 and a data processing section 307, and has a plurality of photoelectric conversion apparatuses 1010.

An irradiation object 300 emits light in a wavelength band corresponding to invisible light. The wavelength conversion section 301 receives the light in the wavelength band corresponding to the invisible light which has been emitted from the irradiation object 300, and emits visible light.

The avalanche diode 201 on which the visible light emitted from the wavelength conversion section 301 is incident performs photoelectric conversion. Then, the photoelectric conversion apparatus 1010 holds a digital signal based on a signal based on the photoelectrically converted charge in the memory 205 via the control section 202, the waveform shaping section 203, and the TDC 204. The plurality of photoelectric conversion apparatuses 1010 may be formed as a single apparatus or may be formed by an array of a plurality of apparatuses.

Signal processing is performed on the plurality of digital signals held in the memories 205 of the plurality of photoelectric conversion apparatuses 1010 by a data processing section 1207. Herein, combination processing of a plurality of images obtained from the plurality of digital signals is performed as signal processing means.

Next, a configuration of the medical diagnosis system such as the PET will be described as a specific example of the invisible light detection system.

A subject corresponding to the irradiation object 300 releases a radiation pair from the inside of a living body. The wavelength conversion section 301 constitutes a scintillator, and the scintillator emits visible light upon incidence of the radiation pair released from the subject.

The avalanche diode 201 on which the visible light emitted from the scintillator is incident performs photoelectric conversion, and the photoelectric conversion apparatus 1010 holds the digital signal based on the signal based on the photoelectrically converted charge in the memory 205 via the control section 202, the waveform shaping section 203, and the TDC 204. That is to say, the photoelectric conversion apparatus 1010 is arranged to detect arrival time of the radiation pair released from the subject and detect the visible light emitted from the scintillator to hold the digital signal in the memory 205.

The signal processing is performed on the digital signals held in the memories 205 of the plurality of photoelectric conversion apparatuses 1010 in the data processing section 1207. Herein, combination processing such as image reconstruction is performed as the signal processing means using the plurality of images obtained from the plurality of digital signals to form an image of the inside of the living body of the subject.

Eleventh Embodiment

Figure 22:
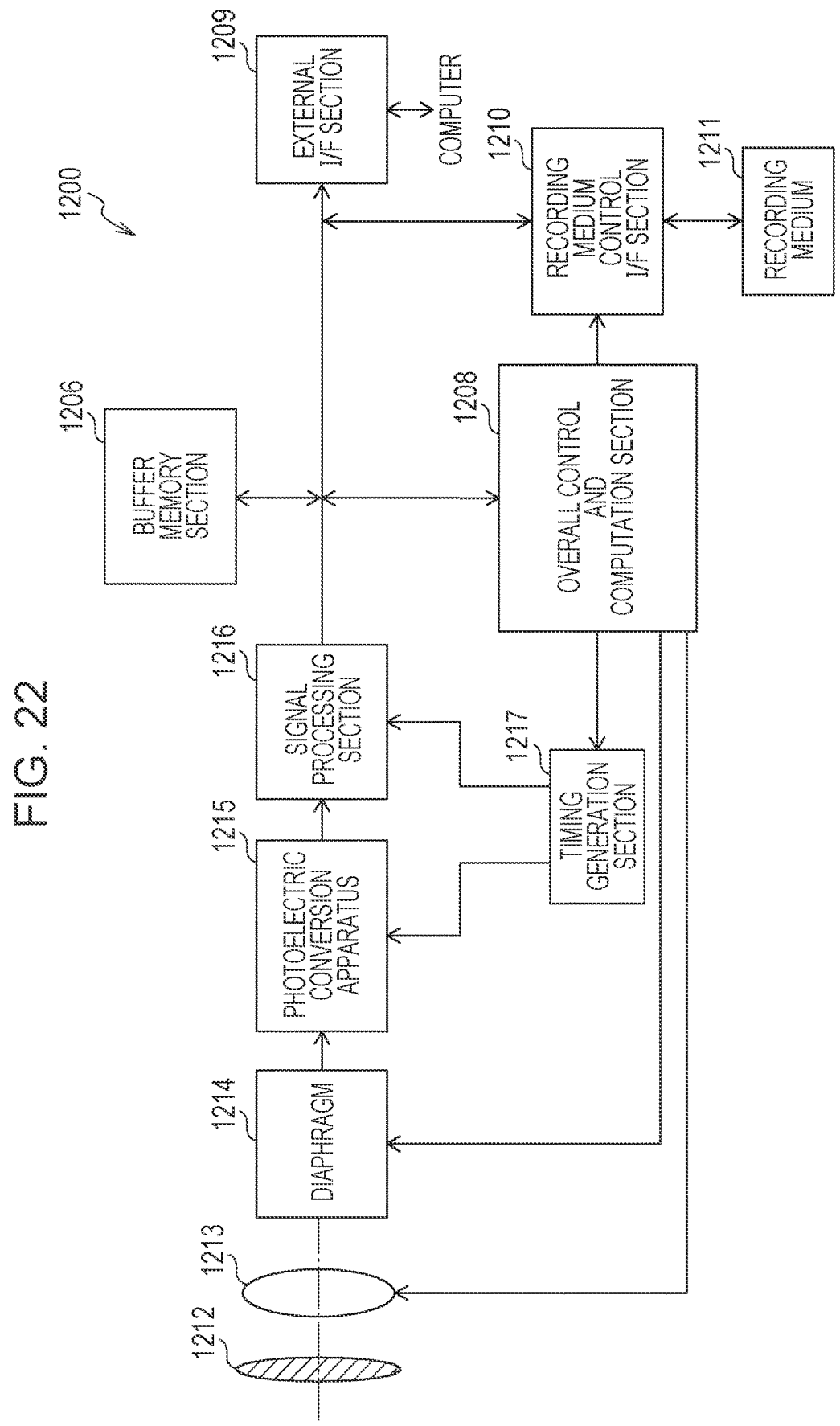
FIG. 22 is a photoelectric conversion system according to an eleventh embodiment.

FIG. 22 is a block diagram illustrating a configuration of a photoelectric conversion system 1200 according to the present embodiment. The photoelectric conversion system 1200 of the present embodiment includes a photoelectric conversion apparatus 1215. Herein, any of the photoelectric conversion apparatuses described according to above-described embodiments can be applied to the photoelectric conversion apparatus 1215. The photoelectric conversion system 1200 can be used as an image pickup system, for example. Specific examples of the image pickup system include a digital still camera, a digital camcorder, a monitoring camera, and the like. FIG. 22 illustrates an example of the digital still camera as the photoelectric conversion system 1200.

The photoelectric conversion system 1200 illustrated in FIG. 22 has the photoelectric conversion apparatus 1215, a lens 1213 for imaging an optical image of the subject on the photoelectric conversion apparatus 1215, a diaphragm 1214 for setting an amount of light that passes through the lens 1213 to be variable, and a barrier 1212 for protecting the lens 1213. The lens 1213 and the diaphragm 1214 are an optical system for collecting light on the photoelectric conversion apparatus 1215.

The photoelectric conversion system 1200 has a signal processing section 1216 that performs processing of an output signal output from the photoelectric conversion apparatus 1215. The signal processing section 1216 performs various types of correction and compression on an input signal as needed, and performs a signal processing operation on a signal to be output. The photoelectric conversion system 1200 further has a buffer memory section 1206 for temporarily storing image data, and an external interface section (external I/F section) 1209 for communicating with an external computer or the like. Furthermore, the photoelectric conversion system 1200 has a recording medium 1211 such as a semiconductor memory for recording or reading image pickup data, and a recording medium control interface section (recording medium control I/F section) 1210 for performing the record to or the read from the recording medium 1211. The recording medium 1211 may be built in the photoelectric conversion system 1200 or may be detachably attached thereto. In addition, communication with the recording medium 1211 from a recording medium control I/F section 1210 and communication from the external I/F section 1209 may be wirelessly carried out.

The photoelectric conversion system 1200 further has an overall control and computation section 1208 that performs various types of computations and also controls the entirety of the digital still camera, and a timing generation section 1217 that outputs various types of timing signals to the photoelectric conversion apparatus 1215 and the signal processing section 1216. Herein, the timing signals and the like may be input from the outside, and it is sufficient when the photoelectric conversion system 1200 has at least the photoelectric conversion apparatus 1215, and the signal processing section 1216 that processes the output signal output from the photoelectric conversion apparatus 1215. As described according to the fourth embodiment, the timing generation section 1217 may be mounted on the photoelectric conversion apparatus. The overall control and computation section 1208 and the timing generation section 1217 may be configured to implement a part or all of control functions of the photoelectric conversion apparatus 1215.

The photoelectric conversion apparatus 1215 outputs an image signal to the signal processing section 1216. The signal processing section 1216 implements predetermined signal processing on the image signal output from the photoelectric conversion apparatus 1215 and outputs image data. In addition, the signal processing section 1216 generates an image using the image signal. In addition, the signal processing section 1216 may perform ranging computation on the signal output from the photoelectric conversion apparatus 1215. It is noted that the signal processing section 1216 or the timing generation section 1217 may be mounted on the photoelectric conversion apparatus. That is to say, the signal processing section 1216 or the timing generation section 1217 may be provided on the substrate on which the pixels are arranged, or may have a configuration to be provided on another substrate. By constituting the image pickup system using the photoelectric conversion apparatus of each of the above-described embodiments, it is possible to realize the image pickup system that can obtain a higher quality image.

Twelfth Embodiment

Figure 23A:
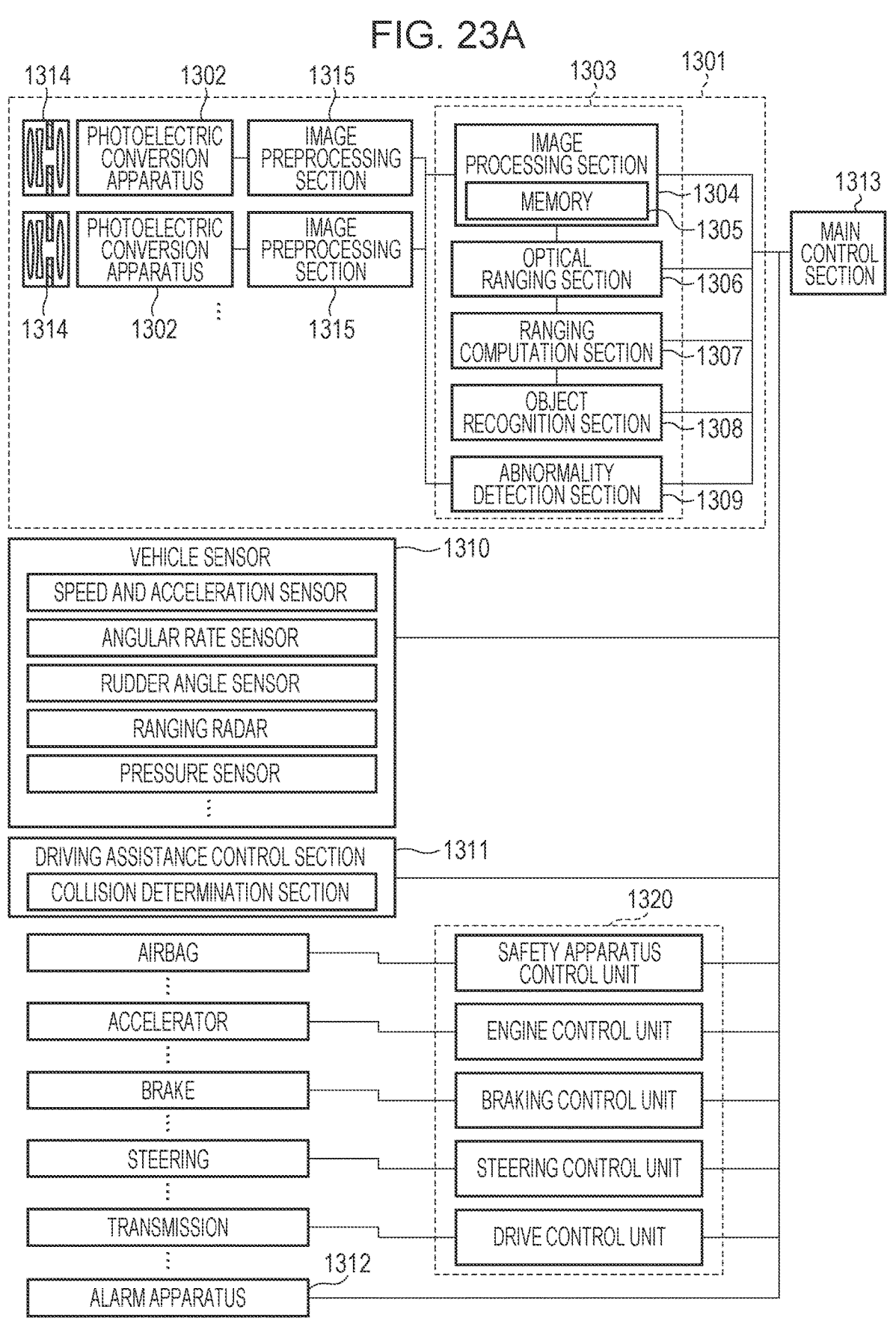
FIG. 23A is a schematic diagram of a photoelectric conversion system and a movable object of a twelfth embodiment.
Figure 23B:
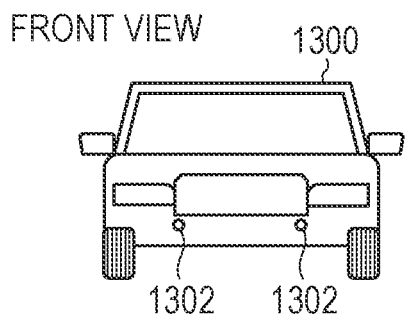
FIG. 23B is a schematic diagram of the photoelectric conversion system and the movable object of the twelfth embodiment.
Figure 23B:
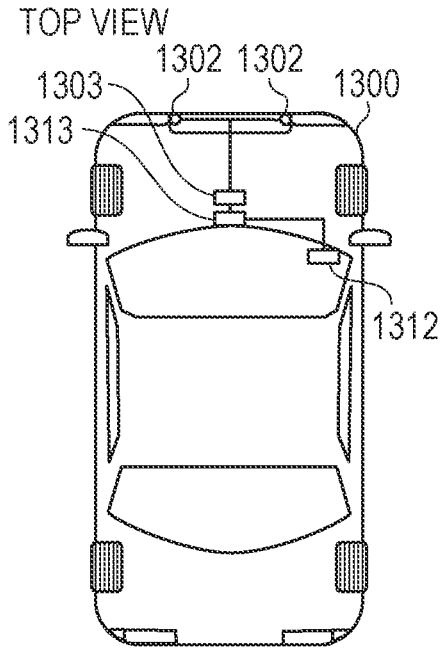
Figure 23B:
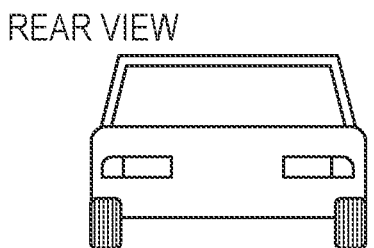
Figure 24:
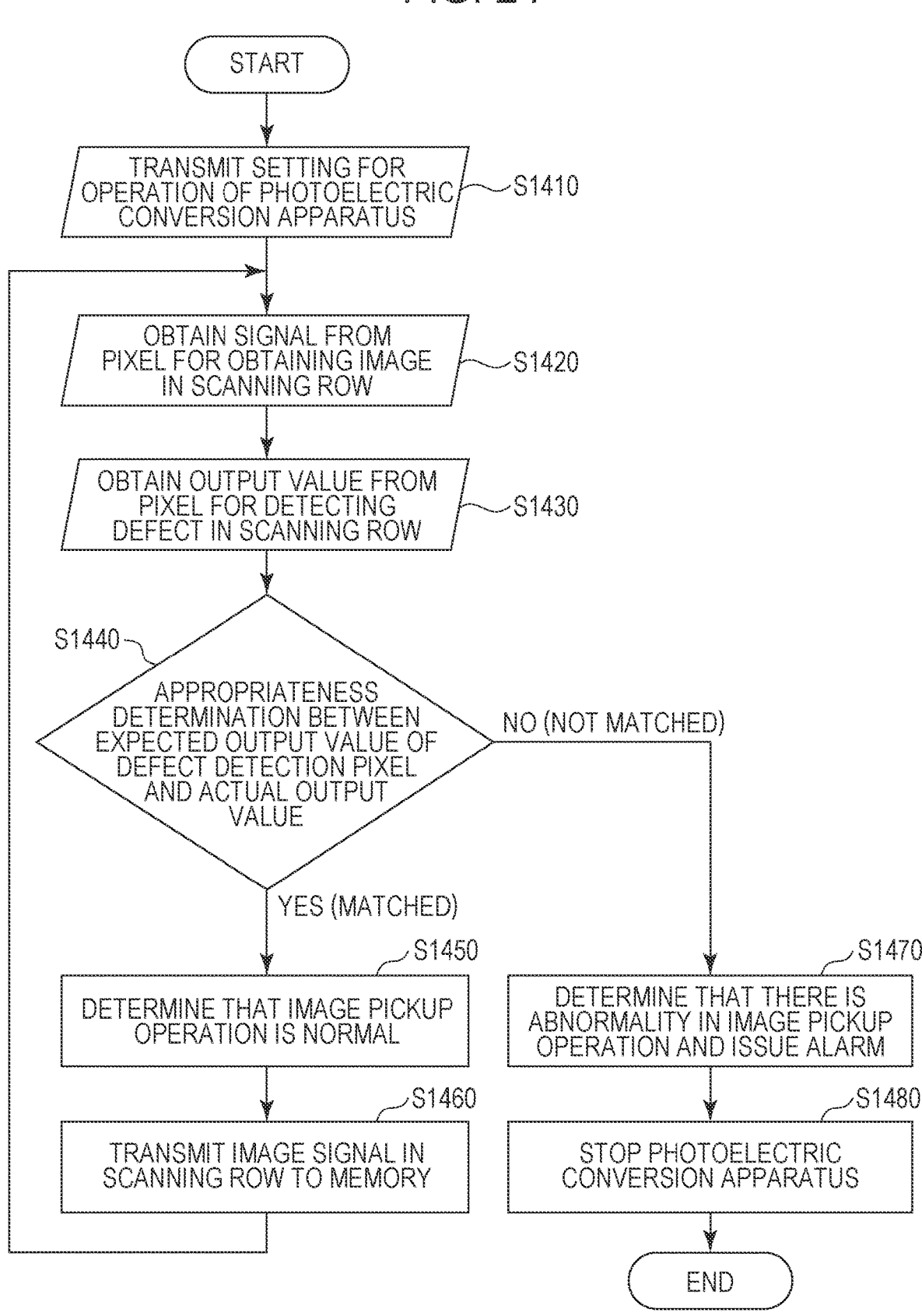
FIG. 24 is a flowchart illustrating an operation of the photoelectric conversion system of the twelfth embodiment.

The photoelectric conversion system and a movable object of the present embodiment will be described using FIGS. 23A and 23B and FIG. 24. FIGS. 23A and 23B include schematic diagrams illustrating configuration examples of the photoelectric conversion system and the movable object according to the present embodiment. FIG. 24 is a flowchart illustrating operation of the photoelectric conversion system according to the present embodiment. According to the present embodiment, an example of an on-vehicle camera is illustrated as the photoelectric conversion system.

FIGS. 23A and 23B illustrate an example of a vehicle system and the photoelectric conversion system which is mounted thereon and performs image pickup. A photoelectric conversion system 1301 includes a photoelectric conversion apparatus 1302, an image preprocessing section 1315, an integrated circuit 1303, and an optical system 1314. The optical system 1314 images an optical image of a subject on the photoelectric conversion apparatus 1302. The photoelectric conversion apparatus 1302 converts the optical image of the subject imaged by the optical system 1314 into an electric signal. The photoelectric conversion apparatus 1302 is any of the photoelectric conversion apparatuses of the above-described respective embodiments. The image preprocessing section 1315 performs predetermined signal processing on the signal output from the photoelectric conversion apparatus 1302. The function of the image preprocessing section 1315 may be embedded in the photoelectric conversion apparatus 1302. At least two pairs of the optical system 1314, the photoelectric conversion apparatus 1302, and the image preprocessing section 1315 are provided in the photoelectric conversion system 1301, the output from the image preprocessing section 1315 of each of the pairs is input to the integrated circuit 1303.

The integrated circuit 1303 is an integrated circuit for use of the image pickup system, and includes an image processing section 1304 including a memory 1305, an optical ranging section 1306, a ranging computation section 1307, an object recognition section 1308, and an abnormality detection section 1309. The image processing section 1304 performs image processing such as development processing or defect correction on the output signal of the image preprocessing section 1315. The memory 1305 stores primary memory of a picked-up image, or a defective position of an image pickup pixel. The optical ranging section 1306 performs focusing of the subject or ranging. The ranging computation section 1307 performs calculation of ranging information from plural pieces of image data obtained by the plurality of photoelectric conversion apparatuses 1302. The object recognition section 1308 performs recognition of a vehicle, a road, a road sign, or a subject such as a person. When an abnormality of the photoelectric conversion apparatus 1302 is detected, the abnormality detection section 1309 alarms the main control section 1313 of the abnormality.

The integrated circuit 1303 may be realized by dedicatedly designed hardware, may be realized by a software module, or may be realized by a combination of these. In addition, the integrated circuit may be realized by an FPGA (Field Programmable Gate Array), an ASIC (Application Specific Integrated Circuit), or the like, or may be realized by a combination of these.

The main control section 1313 governs and controls operations of the photoelectric conversion system 1301, a vehicle sensor 1310, a control unit 1320, and the like. A method may also be adopted in which the photoelectric conversion system 1301, the vehicle sensor 1310, and the control unit 1320 individually have communication interfaces without the main control section 1313, and individually perform transmission and reception via a communication network (for example, CAN standards).

The integrated circuit 1303 has a function of transmitting a control signal or a setting value to the photoelectric conversion apparatus 1302 by receiving a control signal from the main control section 1313 or by its own control section.

The photoelectric conversion system 1301 is connected to the vehicle sensor 1310, and can detect its own vehicle travelling states such as a vehicle speed, a yaw rate, and a rudder angle, and environments outside its own vehicle and states of other vehicles and obstructions. The vehicle sensor 1310 is also distance information obtaining means configured to obtain distance information to a target object. In addition, the photoelectric conversion system 1301 is connected to a driving assistance control section 1311 that performs various driving assistances such as automated steering, automated cruise, and a collision prevention function. In particular, with regard to a collision determination function, a collision estimation against another vehicle and obstruction and the presence or absence of a collision are determined based on detection results of the photoelectric conversion system 1301 and the vehicle sensor 1310. In this manner, an avoidance control in a case where a collision is estimated and safety apparatus activation at the time of the collision are performed.

In addition, the photoelectric conversion system 1301 is also connected to an alarm apparatus 1312 that issues an alarm to a driver based on a determination result in a collision determination section. For example, in a case where a collision probability is high as a determination result of the collision determination section, the main control section 1313 performs a vehicle control to avoid the collision or alleviate a damage by applying the brake, releasing the accelerator, suppressing an engine output, and the like. The alarm apparatus 1312 performs warning to the user by ringing an alarm such as a sound, displaying alarm information on a display section screen such as a car navigation system and a meter panel, providing vibration to a seat belt or steering, and the like.

According to the present embodiment, a surrounding of the vehicle, for example, a front side or a rear side is to be captured by the photoelectric conversion system 1301. FIG. 23B illustrates an arrangement example of the photoelectric conversion system 1301 in a case where the vehicle front side is to be captured by the photoelectric conversion system 1301.

The two photoelectric conversion apparatuses 1302 are arranged on a front side of a vehicle 1300. Specifically, an arrangement where a center line with respect to forward and reverse azimuths or an outer shape (for example, a vehicle width) of the vehicle 1300 is regarded as a symmetric axis to set the two photoelectric conversion apparatuses 1302 in linear symmetry with respect to the symmetric axis is preferably adopted for obtaining distance information between the vehicle 1300 and an object to be captured and determining the collision probability. In addition, the photoelectric conversion apparatuses 1302 are preferably arranged where a view field of the driver is not disturbed when a driver visually recognizes a situation outside the vehicle 1300 from a driver's seat. The alarm apparatus 1312 is preferably arranged within the view field of the driver without difficulty.

Next, a defect detection operation of the photoelectric conversion apparatus 1302 in the photoelectric conversion system 1301 will be described using FIG. 24. The defect detection operation of the photoelectric conversion apparatus 1302 is implemented according to steps S1410 to S1480 illustrated in FIG. 24.

Step S1410 is a step in which setting is performed at the time of startup of the photoelectric conversion apparatus 1302. That is, the setting for the operation of the photoelectric conversion apparatus 1302 is transmitted from the outside of the photoelectric conversion system 1301 (for example, the main control section 1313) or the inside of the photoelectric conversion system 1301, and the image pickup operation and the defect detection operation of the photoelectric conversion apparatus 1302 are started.

Subsequently, in step S1420, a pixel signal is obtained from an effective pixel. In addition, in step S1430, an output value from a defect detection pixel provided for detecting a defect is obtained. This defect detection pixel similarly includes a photoelectric conversion section as in the effective pixel. A predetermined voltage is written in this photoelectric conversion section. The pixel for detecting the defect outputs a signal corresponding to the voltage written in this photoelectric conversion section. It is noted that step S1420 and step S1430 may be reversed.

Subsequently, in step S1440, an appropriateness determination between an expected output value of the defect detection pixel and an actual output value from the defect detection pixel is performed. As a result of the appropriateness determination in step S1440, in a case where the expected output value is matched with the actual output value, the processing step shifts to step S1450, it is determined that the image pickup operation is performed normally, and the processing step shifts to step S1460. In step S1460, a pixel signal in a scanning row is transmitted to the memory 1305 and primarily saved. After that, the processing step returns to step S1420, and the defect detection operation continues. On the other hand, as a result of the appropriateness determination in step S1440, in a case where the expected output value is not matched with the actual output value, the processing step shifts to step S1470. In step S1470, it is determined that there is an abnormality in the image pickup operation, an alarm is issued to the main control section 1313 or the alarm apparatus 1312. The alarm apparatus 1312 causes the display section to display that the abnormality has been detected. Thereafter, the photoelectric conversion apparatus 1302 is stopped in step S1480, and the operation of the photoelectric conversion system 1301 is ended.

It is noted that according to the present embodiment, an example in which the flowchart is looped for each row has been exemplified, but the flowchart may be looped for a plurality of rows, or the defect detection operation may be performed for each frame. The outside of the vehicle may be notified of the issuance of the alarm in step S1470 via a wireless network.

In addition, according to the present embodiment, the control to avoid the collision with another vehicle has been described, but the present embodiment can be applied to a control for automated driving following another vehicle, a control for automated driving so as not to drift from a traffic lane, and the like. Furthermore, the photoelectric conversion system 1301 is not limited to a vehicle such as its own vehicle, but can be applied to a movable object (movable apparatus) such as, for example, a vessel, an airplane, or an industrial robot. In addition, the present embodiment can be applied to not only the movable object but also equipment broadly utilizing an object recognition such as an intelligent transport system (ITS).

The photoelectric conversion apparatus of the present invention may have a configuration in which various types of information such as distance information can be further obtained.

Thirteenth Embodiment

Figure 25:
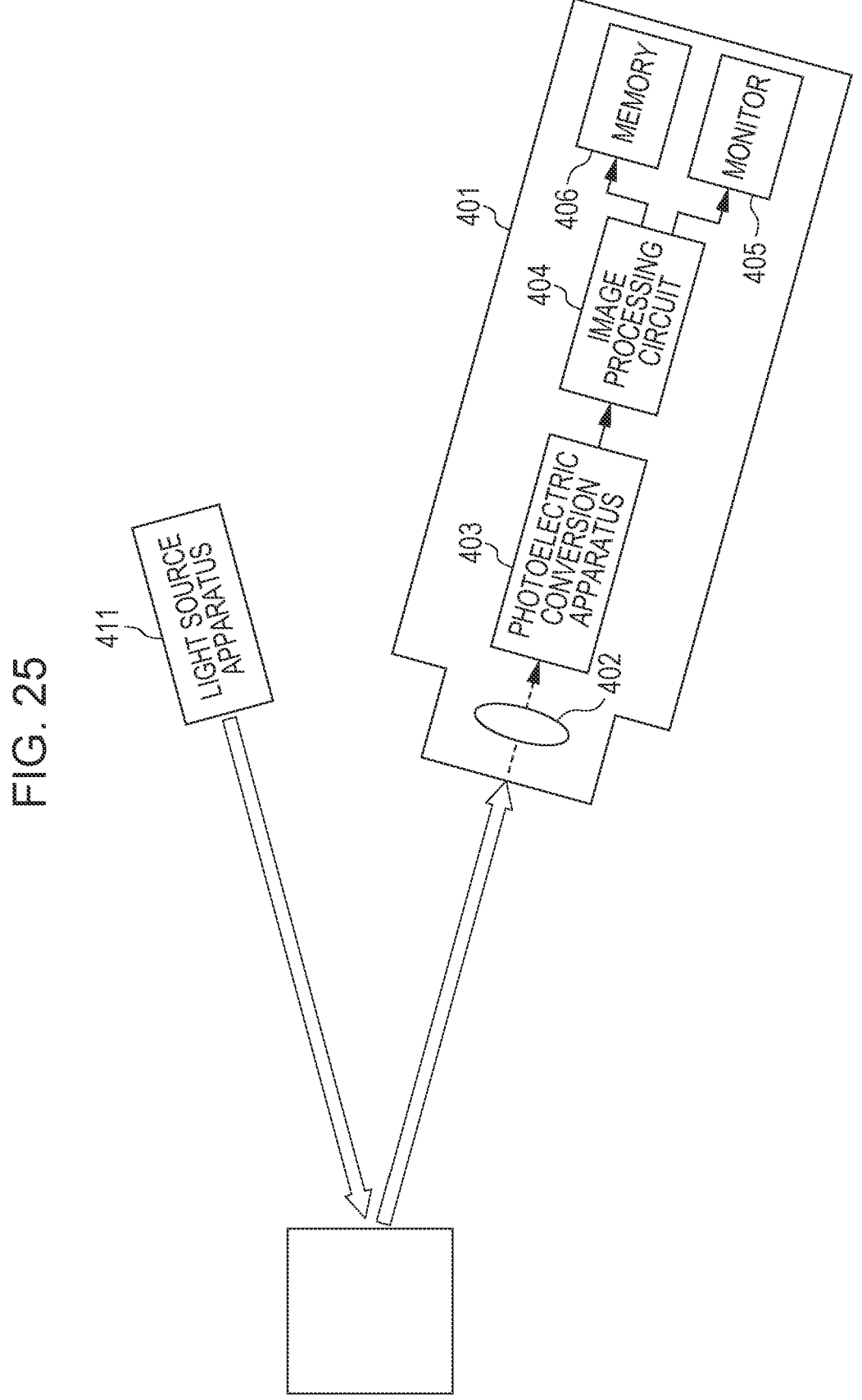
FIG. 25 is a photoelectric conversion system according to a thirteenth embodiment.

FIG. 25 is a block diagram illustrating a configuration example of a distance image sensor corresponding to electronic equipment utilizing the photoelectric conversion apparatus described according to the above-described embodiments.

As illustrated in FIG. 25, a distance image sensor 401 is constituted to include an optical system 402, a photoelectric conversion apparatus 403, an image processing circuit 404, a monitor 405, and a memory 406. Then, the distance image sensor 401 can obtain a distance image according to a distance to a subject when light is projected from a light source apparatus 411 toward a subject, and light reflected on a surface of the subject (modulated light or pulsed light) is received.

The optical system 402 is constituted to have one sheet or a plurality of sheets of lenses, and guides image light (incident light) from the subject to the photoelectric conversion apparatus 403 to form an image on a light reception surface (sensor section) of the photoelectric conversion apparatus 403.

The photoelectric conversion apparatus of each of the embodiments described above is applied as the photoelectric conversion apparatus 403, and a distance signal indicating a distance obtained from a light reception signal output from the photoelectric conversion apparatus 403 is supplied to the image processing circuit 404.

The image processing circuit 404 performs image processing to construct a distance image based on the distance signal supplied from the photoelectric conversion apparatus 403. Then, a distance image (image data) obtained by the image processing is supplied to the monitor 405 to be displayed, or supplied to the memory 406 to be stored (recorded).

In the thus constituted distance image sensor 401, by applying the above-described photoelectric conversion apparatus, along with characteristic improvement of the pixels, for example, the more accurate distance image can be obtained.

Fourteenth Embodiment

A technology according to the present disclosure (present technology) can be applied to various products. For example, the technology according to the present disclosure may be applied to an endoscopic operation system.

Figure 26:
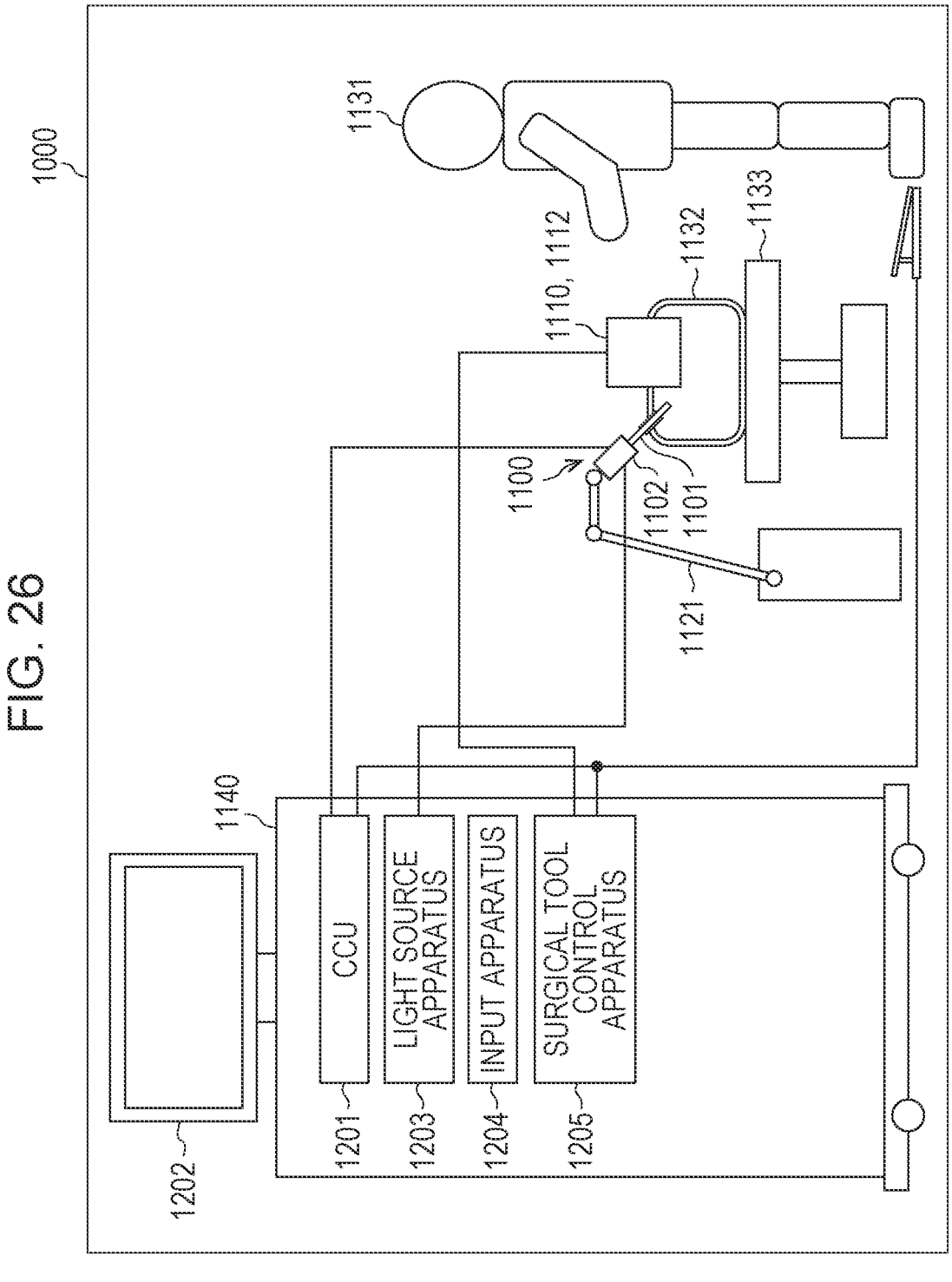
FIG. 26 is a photoelectric conversion system according to a fourteenth embodiment.

FIG. 26 is a diagram illustrating an example of a schematic configuration of the endoscopic operation system to which the technology according to the present disclosure (present technology) may be applied.

FIG. 26 illustrates a situation where an operator (doctor) 1131 performs an operation on a patient 1132 on a patient bed 1133 using the endoscopic operation system 1000. As illustrated in the drawing, the endoscopic operation system 1000 is constituted by an endoscope 1100, an operation instrument 1110, and a cart 1140 on which various types of apparatuses for an operation under the endoscope are loaded.

The endoscope 1100 is constituted by a lens barrel 1101 having a region with a predetermined length from a distal end to be inserted into a body cavity of the patient 1132, and a camera head 1102 connected to a proximal end of the lens barrel 1101. In the example illustrated in the drawing, the endoscope 1100 constituted as a rigid scope having the rigid lens barrel 1101 is illustrated in the drawing, but the endoscope 1100 may be constituted as a so-called flexible scope having a flexible lens barrel.

An opening portion in which an objective lens is fitted is provided at the distal end of the lens barrel 1101. A light source apparatus 1203 is connected to the endoscope 1100, and light generated by the light source apparatus 1203 is guided up to the distal end of the lens barrel by a light guide extending inside the lens barrel 1101, and emitted toward an observation target inside the body cavity of the patient 1132 via the objective lens. It is noted that the endoscope 1100 may be a direct view scope, or may be an oblique view scope or a lateral view scope.

The optical system and the photoelectric conversion apparatus are provided inside the camera head 1102, and reflection light (observation light) from an observation target is collected on the photoelectric conversion apparatus by the optical system. The observation light is photoelectrically converted by the photoelectric conversion apparatus, and an electric signal corresponding to the observation light, that is, an image signal corresponding to an observation image, is generated. The photoelectric conversion apparatus described according to each of the above-described embodiments can be used as the photoelectric conversion apparatus. The image signal is transmitted to a camera control unit (CCU: Camera Control Unit) 1201 as RAW data.

The CCU 1201 is constituted by a CPU (Central Processing Unit), a GPU (Graphics Processing Unit), or the like, and controls operations of the endoscope 1100 and a display apparatus 1202 in an overall manner. Furthermore, the CCU 1201 receives an image signal from the camera head 1102, and applies various types of image processing for displaying an image based on the image signal to the image signal such as, for example, development processing (de-mosaic processing).

The display apparatus 1202 displays the image based on the image signal to which the image processing has been applied by the CCU 1201 by the control from the CCU 1201.

The light source apparatus 1203 is constituted by a light source such as, for example, an LED (Light Emitting Diode), and supplies irradiation light used to capture an operative part or the like to the endoscope 1100.

An input apparatus 1204 is an input interface for the endoscopic operation system 1000. The user can perform input of various types of information and instruction input to the endoscopic operation system 1000 via the input apparatus 1204.

A surgical tool control apparatus 1205 controls the drive of an energy surgical tool 1112 for cauterization of a tissue, incision, sealing of blood vessels, or the like.

The light source apparatus 1203 that supplies the irradiation light used to capture the operative part to the endoscope 1100 is constituted by a white light source which is constituted by, for example, by an LED, a laser light source, or a combination of these. In a case where the white light source is constituted by a combination of RGB laser light sources, since an output intensity and output timing of each color (each wavelength) can be highly precisely controlled, an adjustment of a white balance of the picked-up image can be performed in the light source apparatus 1203. In addition, in this case, laser light from each of the RGB laser light sources is emitted to an observation target in a time division manner, and the drive of the image pickup element of the camera head 1102 is controlled in synchronism with the irradiation timing, so that an image corresponding to each of RGB can also be picked up in a time division manner. According to the method, even when a color filter is not provided in the image pickup element, a color image can be obtained.

In addition, the drive of the light source apparatus 1203 can be controlled such that the intensity of the output light is changed at every predetermined time. The drive of the image pickup element of the camera head 1102 is controlled in synchronism with the timing for changing the intensity of the light to obtain images in a time division manner, and the images are combined, so that an image in a high dynamic range without a so-called black defect or white halation can be generated.

In addition, the light source apparatus 1203 may be configured to be able to supply light in a predetermined wavelength band corresponding to a special light observation. In the special light observation, for example, a wavelength dependence of absorption of light in a body system is utilized. Specifically, when light in a narrow band is emitted as compared with irradiation light (that is, white light) at the time of a normal observation, a predetermined tissue such as a superficial portion of a mucous membrane is captured at a high contrast. Alternatively, in the special light observation, fluorescence observation may be performed in which an image is obtained by fluorescence generated when excitation light is emitted. In the fluorescence observation, it is possible to perform observation of fluorescence from a body system by emitting the excitation light to the body system, obtainment of a fluorescence image in a manner that a reagent such as indocyanine green (ICG) is locally injected to a body system and also excitation light corresponding to a fluorescence wavelength of the reagent is emitted to the body system, and the like. The light source apparatus 1203 may be configured to be able to supply the narrow band light and/or the excitation light corresponding to the above-described special light observation.

Figure 27:
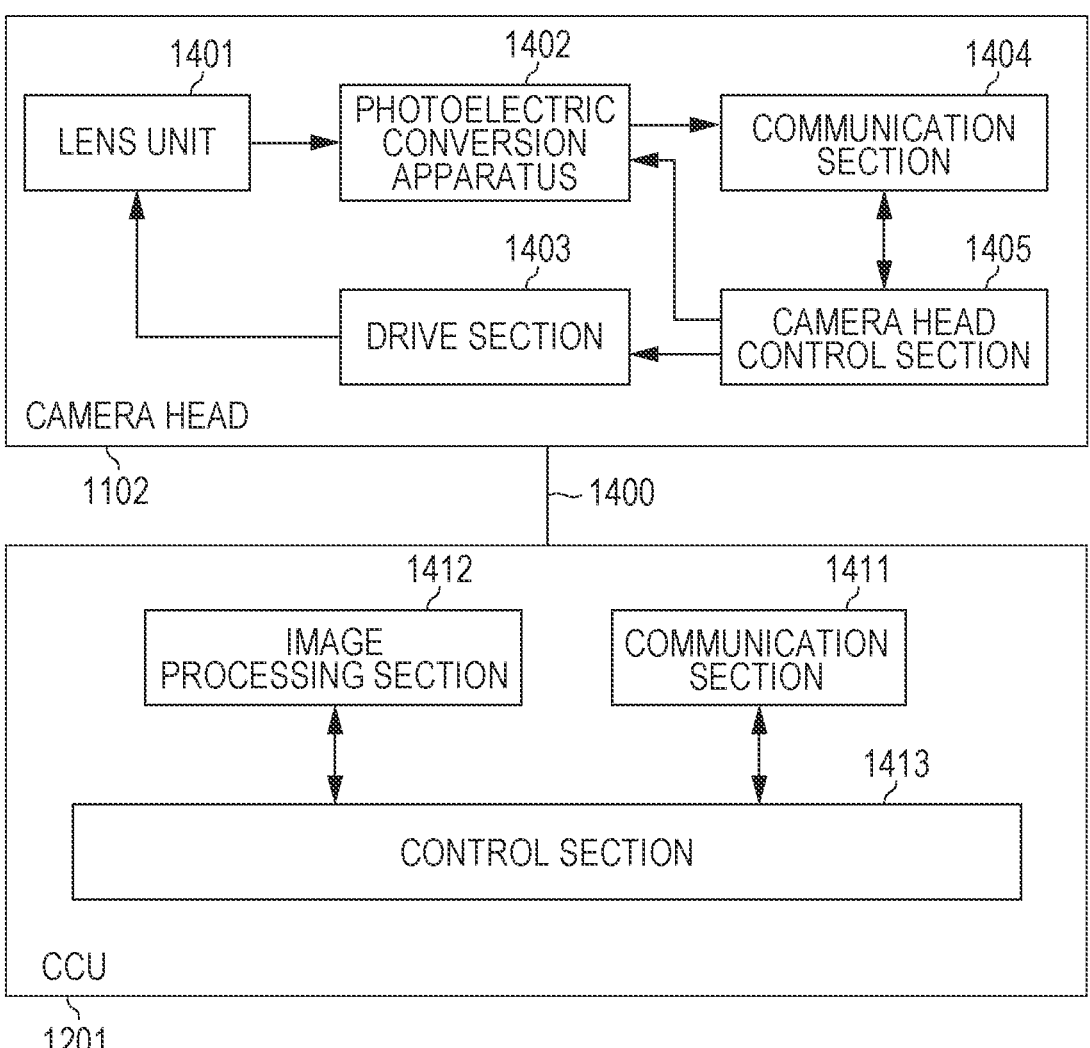
FIG. 27 is a block diagram of the photoelectric conversion system according to the fourteenth embodiment.

FIG. 27 is a block diagram illustrating an example of function configurations of the camera head 1102 and the CCU 1201 illustrated in FIG. 26.

The camera head 1102 has a lens unit 1401, a photoelectric conversion apparatus 1402, a drive section 1403, a communication section 1404, and a camera head control section 1405. The CCU 1201 has a communication section 1411, an image processing section 1412, and a control section 1413. The camera head 1102 and the CCU 1201 are connected to be communicable to each other by a transmission cable 1400.

The lens unit 1401 is an optical system provided in a connection portion with the lens barrel 1101. The observation light taken from the distal end of the lens barrel 1101 is guided up to the camera head 1102 and incident on the lens unit 1401. The lens unit 1401 is constituted by a combination of a plurality of lenses including a zoom lens and a focus lens.

The photoelectric conversion apparatus of each of the above-described embodiments can be used as the photoelectric conversion apparatus 1402. The photoelectric conversion apparatus 1402 may be constituted by a single photoelectric conversion apparatus, or may be constituted by a plurality of photoelectric conversion apparatuses. In a case where the photoelectric conversion apparatus 1402 is constituted by the plurality of photoelectric conversion apparatuses, for example, an image signal corresponding to each of RGB may be generated by each of the photoelectric conversion apparatuses, and those may be combined to obtain a color image. Alternatively, the photoelectric conversion apparatus 1402 may be constituted to have a pair of photoelectric conversion apparatuses for respectively obtaining image signals for a right eye and a left eye corresponding to 3D (Dimensional) display. When the 3D display is performed, an operator 1131 can more accurately grasp a depth of living body tissue in the operative part. It is noted that in a case where the photoelectric conversion apparatus 1402 is constituted by the plurality of photoelectric conversion apparatuses, a plurality of systems of the lens units 1401 may be provided corresponding to the respective photoelectric conversion apparatuses.

The drive section 1403 is constituted by an actuator, and the zoom lens and the focus lens of the lens unit 1401 are moved by a predetermined distance along an optical axis by the control from the camera head control section 1405. In this manner, a magnification and a focus of the picked-up image by the photoelectric conversion apparatus 1402 may be appropriately adjusted.

The communication section 1404 is constituted by a communication apparatus configured to transmit and receive various types of information with the CCU 1201. The communication section 1404 transmits the image signal obtained from the photoelectric conversion apparatus 1402 as the RAW data to the CCU 1201 via the transmission cable 1400.

In addition, the communication section 1404 receives, from the CCU 1201, a control signal for controlling the drive of the camera head 1102, and supplies the control signal to the camera head control section 1405. The control signal includes information related to image pickup conditions such as, for example, information indicating a specification of a frame rate of the picked-up image, information indicating a specification of an exposure value at the time of image pickup, and/or information indicating a specification of a magnification and a focus of the picked-up image.

It is noted that the above-described image pickup conditions such as the frame rate, the exposure value, the magnification, and the focus may be appropriately specified by the user, or automatically set by the control section 1413 of the CCU 1201 based on the obtained image signal. In the latter case, a so-called AE (Auto Exposure) function, an AF (Auto Focus) function, and an AWB (Auto White Balance) function are mounted on the endoscope 1100.

The camera head control section 1405 controls the drive of the camera head 1102 based on the control signal from the CCU 1201 which is received via the communication section 1404.

The communication section 1411 is constituted by a communication apparatus configured to transmit and receive various types of information with the camera head 1102. The communication section 1411 receives, from the camera head 1102, the image signal transmitted via the transmission cable 1400.

In addition, the communication section 1411 transmits the control signal for controlling the drive of the camera head 1102 to the camera head 1102. The image signal and the control signal can be transmitted by electrical communication, optical communication, or the like.

The image processing section 1412 applies various types of image processing to the image signal corresponding to the RAW data transmitted from the camera head 1102.

The control section 1413 performs various types of controls related to image pickup of the operative part or the like by the endoscope 110, and display of a picked-up image obtained by the image pickup of the operative part or the like. For example, the control section 1413 generates the control signal for controlling the drive of the camera head 1102.

In addition, the control section 1413 causes the display apparatus 1202 to display the picked-up image in which the operative part or the like is captured, based on the image signal to which the image processing has been applied by the image processing section 1412. At this time, the control section 1413 may recognize various types of objects in the picked-up image using various types of image recognition technologies. For example, the control section 1413 can recognize an operation instrument such as forceps, a particular living body site, bleeding, mist at the time of use of the energy surgical tool 1112, and the like by detecting a shape, a color, and the like of an edge of an object included in the picked-up image. When the display apparatus 1202 is caused to display the picked-up image, the control section 1413 may cause various types of operation assistance information to be overlapped and displayed on an image of the operative part using the recognition result. When the operation assistance information is overlapped and displayed to be presented to the operator 1131, burden of the operator 1131 can be relieved, and the operator 1131 can certainly progress the operation.

The transmission cable 1400 connecting the camera head 1102 and the CCU 1201 is an electric signal cable corresponding to communication of an electric signal, an optical fiber corresponding to optical communication, or a composite cable of these.

Herein, in the example illustrated in the drawing, communication is performed in a wired manner using the transmission cable 1400, but the communication between the camera head 1102 and the CCU 1201 may be wirelessly performed.

The example of the endoscopic operation system to which the technology according to the present disclosure may be applied has been described above. The technology according to the present disclosure may be applied to (the photoelectric conversion apparatus 1402 of) the endoscope 1100, the camera head 1102, or the like among the configurations described above. By applying the technology according to the present disclosure to (the photoelectric conversion apparatus 1402 of) the endoscope 1100, the camera head 1102, or the like, an influence from after-pulse generated by the avalanche amplification can be reduced.

It is noted that herein, the endoscopic operation system has been described as an example, but the technology according to the present disclosure may be applied to others such as, for example, a microsurgery system.

Fifteenth Embodiment

The photoelectric conversion system according to a fifteenth embodiment will be described using FIGS. 28A to 28C and FIG. 29.

Figure 28A:
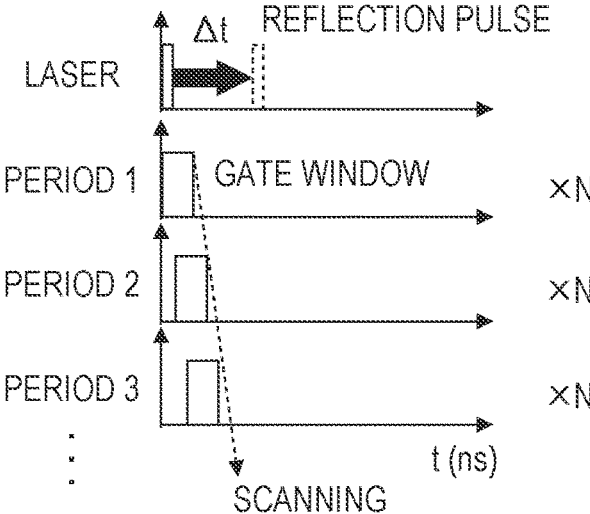
FIG. 28A is a photoelectric conversion system according to a fifteenth embodiment.

FIG. 28A is a diagram illustrating the drive of time gating ToF (Time of Flight). Laser pulse light is emitted plural times toward an object of a distance measurement target. Light reflected by the object is detected by a detector (photoelectric conversion apparatus described above) together with a delay of $\Delta t$. In a typical time gate measurement, a gate window (light detection period by the photoelectric conversion apparatus) is gradually shifted to perform scanning, and information of continuous frames is obtained. In the gate window at each position, photon counting is integrated for N times. When gate scanning is finely performed, time resolution is improved, but there is a disadvantage that a measurement time is lengthened.

Figure 28B:
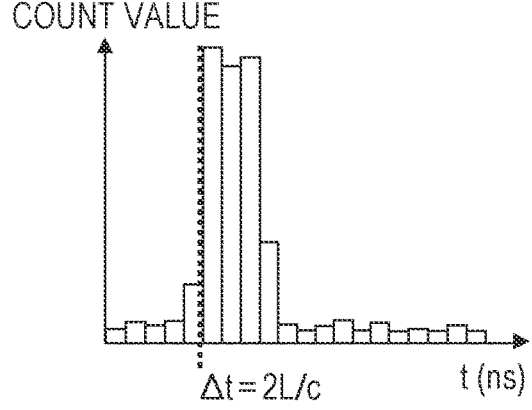
FIG. 28B is the photoelectric conversion system according to the fifteenth embodiment.

FIG. 28B illustrates a measurement result converted into a histogram. The histogram includes a photon count value of a background, and a value of a dark current component in a case where reflection laser pulse is present outside the gate window. In the histogram, in a case where a peak intensity of the reflected light is larger than a count value of the background component, a profile of a count value of the reflected light becomes a rectangular distribution. This rectangular distribution has a width corresponding to a length of the gate window. A delay time Δt can be obtained from a rise or a fall of a profile of a count value. A distance L from the object to the detector is calculated by L=cΔt/2. Where c denotes a light speed.

Figure 28C:
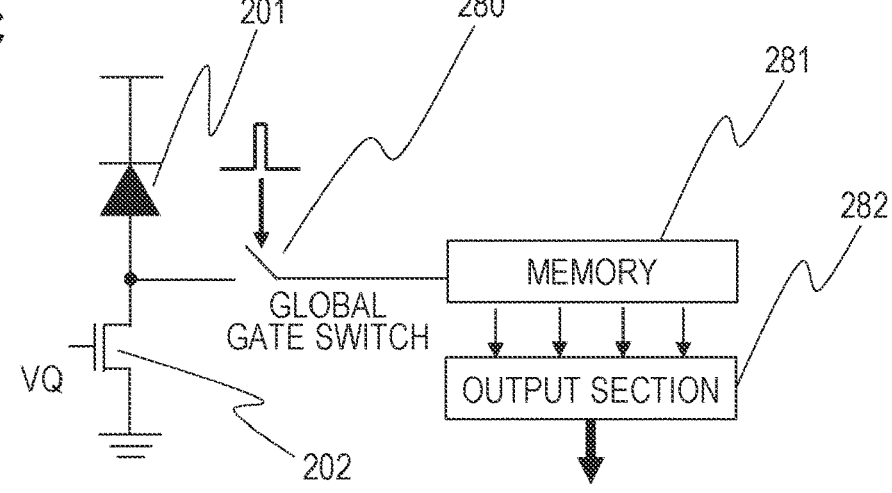
FIG. 28C is the photoelectric conversion system according to the fifteenth embodiment.

FIG. 28C illustrates a time gate type SPAD pixel. A transistor serving as the quench element 202 is connected to the avalanche diode 201. The quench element 202 is an element configured to suppress electron avalanche (avalanche breakdown). When a global gate switch 280 switches on from being off, an output signal from the avalanche diode 201 is selectively output to a memory 281. A control pulse at the gate is approximately several nano seconds, and is controlled in synchronism with the irradiation of laser pulse. The memory 281 provided for each pixel is provided inside the counter circuit 204 of FIG. 2, and the signal stored in the memory 281 is read via an output section 282. It is noted that a certain voltage may be applied to a gate voltage VQ of the quench element 202. In addition, to forcibly recharge the avalanche diode 201 before the global gate switch 280 is put into an on state, the drive for inputting a pulse signal to VQ may be performed.

Figure 29:
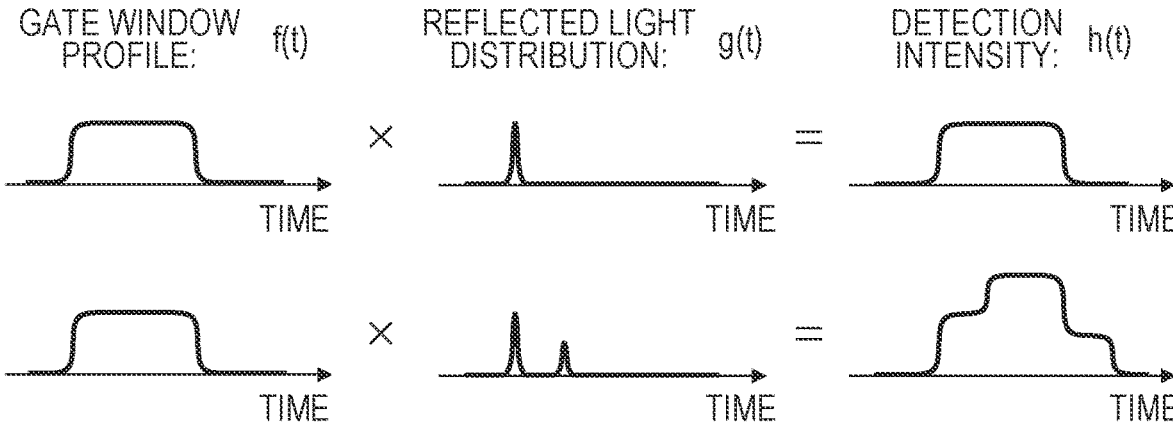
FIG. 29 is the photoelectric conversion system according to the fifteenth embodiment.

FIG. 29 illustrates a gate window profile, a reflected light distribution, and a detection intensity. A detection intensity h(t) corresponds to a convolution computation (convolution) of two functions. That is, convolution of a gate window profile f(t) and a reflected light distribution g(t) corresponds to the detection intensity h(t). In FIG. 29, a top diagram illustrates one reflection peak, and a bottom diagram illustrates two reflection peaks. In an actual measurement environment, a detected intensity profile has a complex shape. For example, this is a case where laser light is emitted to an object via a translucent object (semi-reflective object), or the like. In this case, light reflected by the translucent object such as glass or transparent plastic and light transmitted through the translucent object and emitted to the object are both detected. The bottom diagram of FIG. 29 illustrates the above-described measurement example. Since the detection intensity h(t) is measurement data and the gate window profile f(t) is already known, the reflected light distribution g(t) can be obtained by a deconvolution computation (deconvolution). When the reflected light distribution g(t) can be obtained, distance information to the translucent object or the object can be obtained, and only the distance information to the object can also be separated.

The present embodiment is one type of the distance image sensor described according to the thirteenth embodiment, and the above-described detection and the computation of the distance information are performed by the photoelectric conversion apparatus 403. The formation of the distance image is performed by the image processing circuit 404 based on the obtained distance signal. The formed distance image is supplied to the monitor 405 to be displayed, or is supplied to the memory 406 to be stored.

Experimental Example

Figures 30A, 30B, 30C:
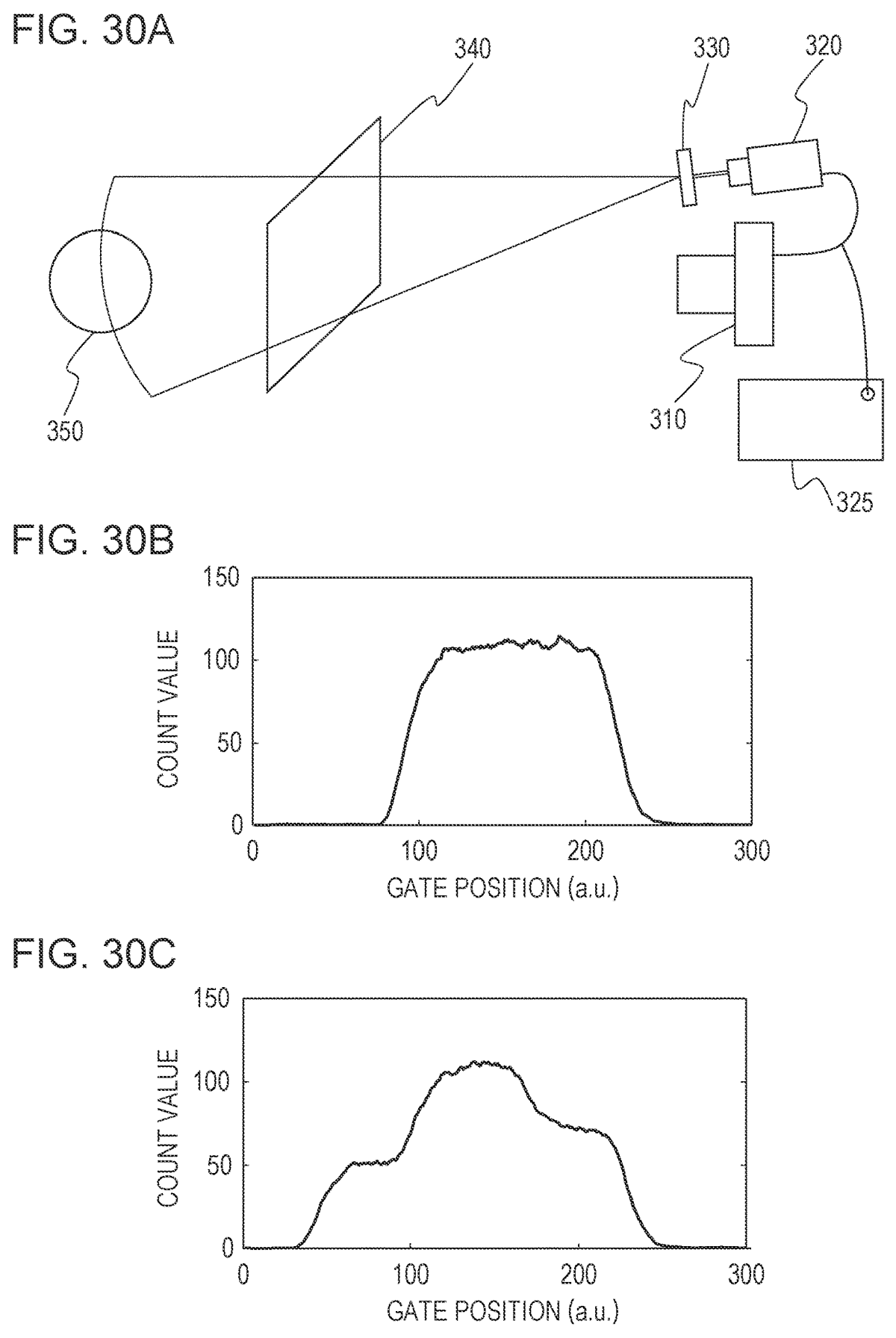

FIGS. 30A to 30C illustrate an experimental example of the fifteenth embodiment.

FIG. 30A is a diagram illustrating a setup of an experiment. Pulse laser light is emitted at 40 MHz from a laser 320 at 510 nm. An object 350 is irradiated with pulse laser light diffused by a light diffusion member 330. A SPAD camera 310 and the laser 320 are configured to be synchronized with each other by a pulse generator 325. A transparent plate 340 made of plastic is provided between the SPAD camera 310 and the object 350.

FIG. 30B and FIG. 30C illustrate a relationship between a position of the gate window (gate position) and a detected count value in a pixel corresponding to a particular location of the object 350. FIG. 30B is a profile in a case where the transparent plate 340 is not provided, and FIG. 30C is a profile in a case where the transparent plate 340 is provided. The profile of FIG. 30C has a rise in two stages (a position 40 and a position 100). A profile having this two-stage rise corresponds to double reflections from the transparent plate 340 and the object 350. The reflected light distribution is obtained from the measurement profiles of FIGS. 30B and 30C, and the distance information is obtained from the reflected light distribution. The distance information and light intensity distribution information are obtained in each of two-dimensionally arranged pixels, and three-dimensional imaging can be performed when the light intensity distribution information is displayed in monochrome and the distance information is displayed in color.

In addition, when the distance information is obtained, the three-dimensional imaging in which a distance range is specified can be performed. For example, a signal a short distance from the SPAD camera and a signal a long distance from the SPAD are separated from each other, so that separate three-dimensional imaging images can be formed.

For example, in a case where the transparent plate is window glass of a vehicle and only an object back of the window glass is desired to be observed, when distance image formation of both the window glass and the object is performed using an indirect type ToF method or the like which is generally used, an error may be caused in the distance measurement due to an influence of reflection by the window glass. In this case, as described according to the twelfth embodiment, in a case where the movable object (example: an automobile) is controlled by the distance measurement, an intended control may be performed, and an issue may occur in terms of safety. According to the present embodiment, such a concern can be reduced since the objects with different distances from the camera can be separately subjected to the three-dimensional imaging.

Sixteenth Embodiment

The photoelectric conversion apparatus corresponding to a sixteenth embodiment will be described using FIGS. 31A and 31B.

Figure 31A:
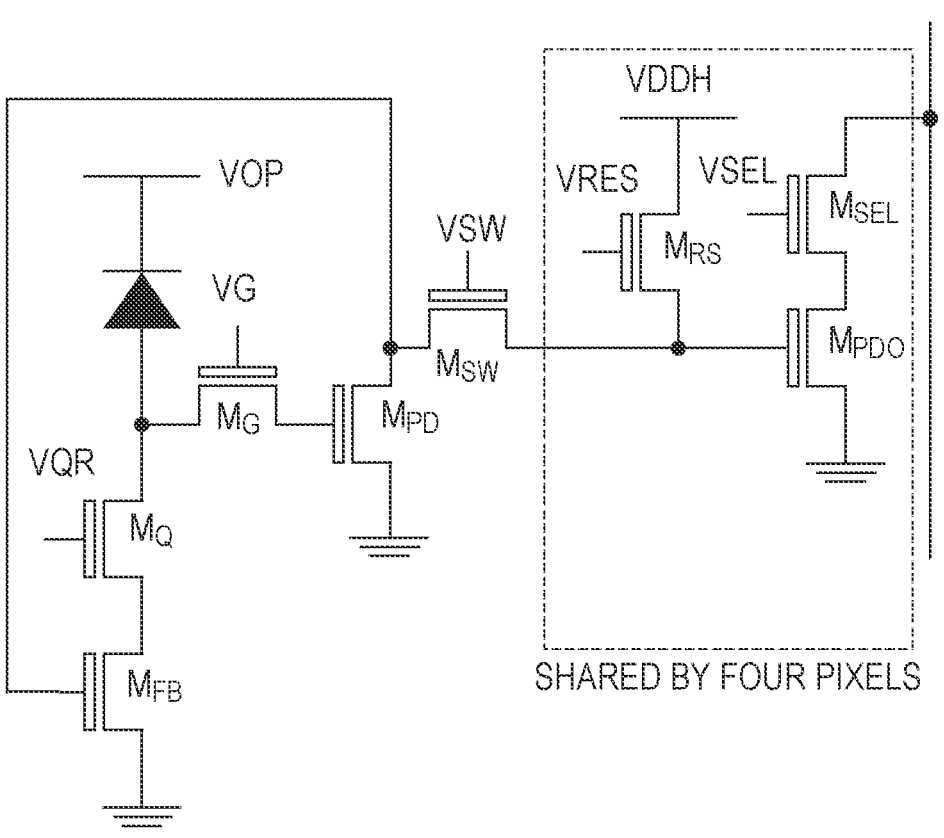
FIG. 31A is a photoelectric conversion apparatus according to a sixteenth embodiment.

FIG. 31A is a circuit diagram of the pixel. Specifically, FIG. 31A illustrates a circuit that the photoelectric conversion section 101 of FIG. 2 has. The avalanche current generated in the avalanche diode is converted into a voltage via a quench transistor $M_Q$ controlled by VQR. A voltage pulse is transferred to a pulldown transistor $M_{PD}$ via a gating transistor $M_G$ controlled by VG. As a result, a feedback transistor $M_{FB}$ is put into an off state. In this manner, a source of the quench transistor $M_Q$ is put into a nonconnection state to disable a quench function in the SPAD. A drain voltage of the pulldown transistor $M_{PD}$ is maintained for a sufficiently long period of time to be close to a ground voltage (earth voltage) until signals on the entire chip are read. For the next light detection, charge to a potential of VDDH-VTH-VDSAT is performed. Thereafter, the feedback transistor $M_{FB}$ returns from an off state to an on state. A transistor $M_{SW}$ controlled by VSW is connected to a drain of the pulldown transistor $M_{PD}$ and a source of a transistor $M_{RS}$, and the source of the transistor $M_{RS}$ is pre-charged to VDD-VTH through a control signal VRES. When a transistor $M_{SEL}$ is put into an on state by VSEL, a transistor $M_{PDO}$ is used for pulldown for the entire column. For example, rows are line-sequentially selected.

Herein, the transistor $M_{RS}$, the transistor $M_{PDO}$, and the transistor $M_{SEL}$ as indicated by a dotted line are shared by a plurality of pixels (plurality of avalanche diodes). Specifically, those transistors are shared by four pixels (four avalanche diodes) in two rows and two columns. Since the same circuit is shared by the plurality of pixels, still more avalanche diodes can be arranged in the same area. According to the above-described embodiment, as illustrated in FIGS. 5A to 5C, when the potential barrier formed by the first isolation portion 20 is set to be lower than the potential barrier formed by the second isolation portion 30, the pixel size is decreased while the crosstalk is lowered. In addition to this, by using the pixel circuit of the present embodiment, since the pixel size can be further reduced when arrayed, it is possible to provide a SPAD array sensor with still more pixels.

A feedback loop that the pixels of the present embodiment have can prevent occurrence of subsequent avalanche in the frame. The feedback loop can suppress a current from a cathode voltage node VOP. Since a case of over 100,000 counts may affect power dissipation, it can be mentioned that this is advantageous in a large-area array.

Figure 31B:
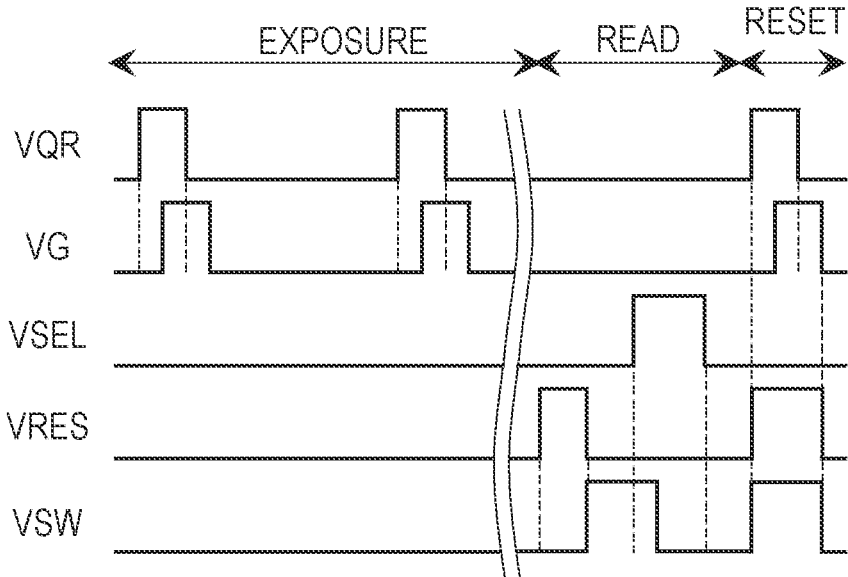
FIG. 31B is the photoelectric conversion apparatus according to the sixteenth embodiment.

FIG. 31B is a diagram illustrating a driving method. When VQR and VG shift from a H level to an L level, exposure is started, and when VQR and VG shift from the L level to the H level, exposure for one subframe is performed. At this time, an exposure period of the subframe is substantially defined as a period from timing at which VQR shifts from the H level to the L level to timing at which VG shifts from the H level to the L level. When the subframe period is repeated plural times, it is possible to obtain a sufficient photon count value even for a feeble optical signal. During a read period, first, VRES is set at the H level to reset a source terminal of $M_{RS}$. Next, VSW is set at the H level to write an output signal to the source terminal of $M_{RS}$. A case where a photon is detected during the exposure period corresponds to the L level, and a case where a photon is not detected corresponds to the H level. Furthermore, VSEL is set at the H level to output a pixel signal to a vertical signal line. After the read is completed, all VRES, VSW, VQR, and VG are set at the H level at the same time to perform reset.

Seventeenth Embodiment

Figure 32:
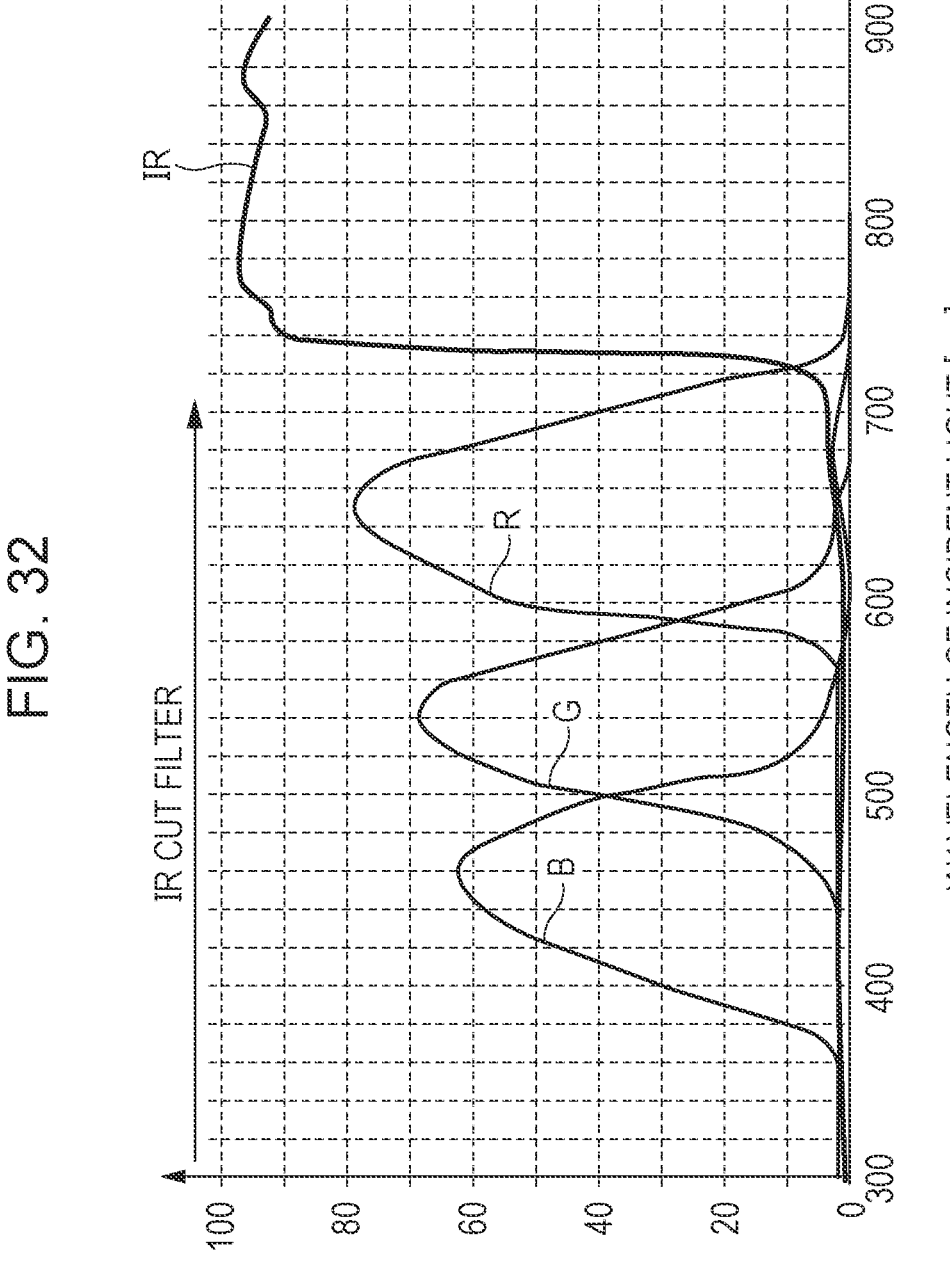
FIG. 32 is spectral transmittances of filters according to a seventeenth embodiment.

Filters of the photoelectric conversion apparatus corresponding to a seventeenth embodiment will be described using FIG. 32, and FIGS. 33A and 33B, FIG. 34, and FIGS. 35A and 35B. FIG. 32 is a graph representing a spectral transmittance of each of the filters, and FIGS. 33A and 33B, FIG. 34, and FIGS. 35A and 35B illustrate specific arrangement examples of the filters in the photoelectric conversion apparatus of the present embodiment.

Such a filter for transmitting light of a particular wavelength component to an avalanche photodiode arranged on a substrate may be provided in the photoelectric conversion apparatus. The filter is, for example, a color filter (which may also be denoted as CF), an infrared light filter, an infrared light cut filter, or the like. These filters may be individually used, or may be used in combination.

The CF is, for example, a filter for transmitting visible light such as red, green, or blue. Hereinafter, red, green, and blue are denoted as R, G, and B. In addition, a pixel on which the CF of R is arranged is denoted as an R pixel, a pixel on which the CF of G is arranged is denoted as a G pixel, and a pixel on which the CF of B is arranged is denoted as a B pixel. In addition, in a case where the R pixel, the G pixel, and the B pixel are collectively denoted, these may be denoted as RGB pixels. In addition, infrared light is hereinafter indicated as IR. A pixel on which a filter for transmitting IR is denoted as an IR pixel.

FIG. 32 illustrates the spectral transmittance of the filter. FIG. 32 is a graph in which a horizontal axis represents a wavelength (unit: nm), and a vertical axis represents a spectral transmittance (unit: %). First, a range of a wavelength of visible light is generally in a range from 400 nm or higher and below 700 nm, and a range of a wavelength of infrared light is from 750 nm or higher to 1 mm or lower. Herein, a spectral transmittance of the IR filter is 50% or higher in the wavelength range at or above at least 700 nm, and is less than 50% in the wavelength range below 700 nm. That is to say, the IR filter refers to a filter for mainly transmitting infrared light, and visible light is cut. As represented by a solid line IR in FIG. 19, the spectral transmittance of the IR filter indicates a value at or above 90% in the vicinity of 740 nm, but does not exceed 50% at 700 nm or lower. On the other hand, the spectral transmittance of the IR filter is 50% or above in the wavelength range below 700 nm. That is to say, a visible light filter refers to a filter for mainly transmitting visible light. It is sufficient when the visible light filter transmits light in the wavelength range of visible light at or below the wavelength of infrared light, and for example, transmits light with the wavelength below 700 nm. As represented by solid lines R, G, and B in FIG. 32, the spectral transmittances of the respective visible light filters exceed 50% in a particular wavelength below 700 nm. For example, a peak of the spectral transmittance of the R filter is approximately 650 nm, a peak of the spectral transmittance of the G filter is approximately 550 nm, and a peak of the spectral transmittance of the B filter is approximately 450 nm. The visible light filter may partially transmit light in the wavelength range of infrared light, but to remove the influence of infrared light, the visible light filter may be designed so as not to transmit light in the wavelength range of infrared light, for example, light at 700 nm or above. That is to say, the visible light filter may have a function as a so-called IR cut filter. In addition, the visible light filter may include an infrared light cut filter that cuts light at, for example, 700 nm or above. FIG. 32 exemplifies a range in which the IR cut filter transmits light. A material of each of the filters may be an organic material or may be an inorganic material. It is noted that transmitting no light or being opaque is not limited to a state in which 100% of light is not transmitted. For example, such a state refers to a state where 50% or more of light is transmitted.

FIG. 33A describes an arrangement example having a so-called Bayer array. A CF ratio of R:G:B is 1:2:1.

FIG. 33B illustrates an arrangement example of the CF of RGBW12. According to this array, each of the CFs is arranged at a ratio of R:G:B:W=1:2:1:12 in a 4×4 pixel array. W refers to a white pixel that is a pixel where the CF is not arranged. The W pixel is arranged to be adjacent to any pixel of the R pixel, the G pixel, and the B pixel corresponding to the color pixels in each of an up and down direction, a left and right direction, and an oblique direction in plan view. That is, each of the R pixel, the G pixel, and the B pixel is surrounded by eight W pixels. The W pixels occupy at a ratio of 3/4 among all of the pixels. A circumference of each of the RGB pixels corresponding to the color pixels is surrounded by the W pixels, and an interpolation precision for interpolating a signal of the W pixel is improved for each of signals of the R pixel, the G pixel, and the B pixel.

FIG. 34 is an arrangement example in which the IR pixels are used instead of the W pixels of FIG. 33B. Such a filter arrangement may be used.

Figure 35A:
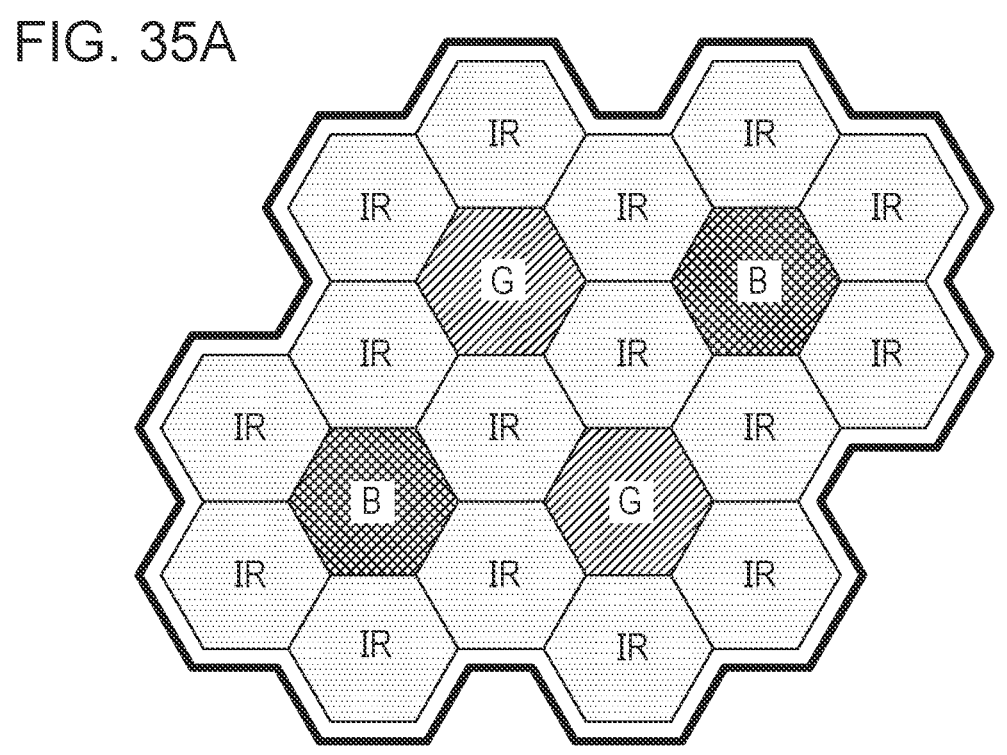
FIG. 35A is an arrangement example of the pixels and the filters according to the seventeenth embodiment.
Figure 35B:
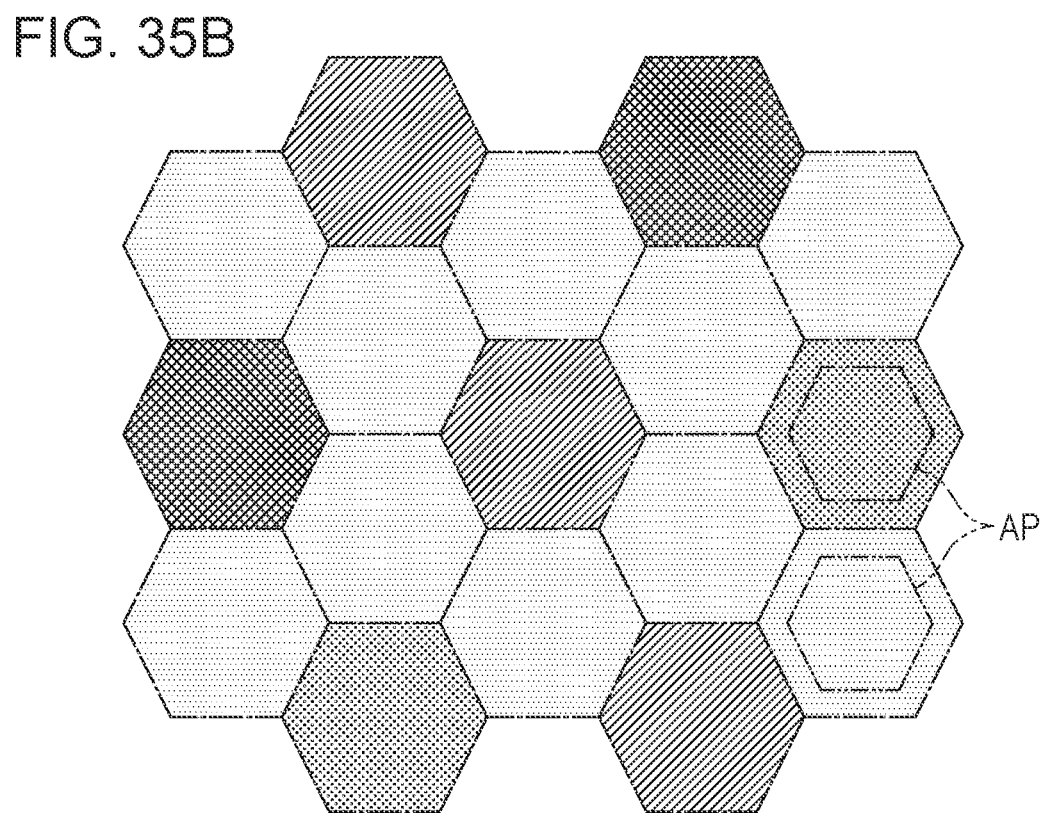
FIG. 35B is an arrangement example of the pixels and the filters according to the seventeenth embodiment.

In addition, as illustrated in FIGS. 35A and 35B, each of the pixels may be arranged in a honeycomb shape. In FIGS. 35A and 35B, the IR pixels are arranged, but the W pixels may be used instead of the IR pixels.

In this manner, the photoelectric conversion apparatus according to the present embodiment can adopt various filter arrangements.

Various modifications can be made for the present invention without being limited to the above-described embodiments. For example, an example in which a part of the configurations of any embodiments is added to another embodiment and an example in which replacement with a part of the configurations of another embodiment is carried out are also embodiments of the present invention.

It is noted that the above-described embodiments are all merely examples of embodiments when the present invention is to be implemented, and a technical scope of the present invention is not to be construed in a limited manner by these. That is, the present invention can be implemented in various forms without departing from its technical concept or its main features.

For example, the example in which the filter is arranged has been illustrated according to the seventeenth embodiment, but the photoelectric conversion apparatus of each of the embodiments may be used as the photoelectric conversion apparatus that photoelectrically converts monochrome light without an arrangement of a CF or IR cut filter or a visible light cut filter.

According to the present invention, in the photoelectric conversion apparatus using the avalanche diode, a pixel size can be decreased while an increase in dark current is suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion apparatus comprising:
a first avalanche diode including a first semiconductor region of a first conductivity type in which majority carriers are charge carriers of the same conductivity type as signal charge; and a second avalanche diode including a second semiconductor region of the first conductivity type and arranged to be adjacent to the first avalanche diode, wherein
a first isolation portion is arranged between the first semiconductor region and the second semiconductor region,
the first isolation portion is constituted by a third semiconductor region of the first conductivity type,
a seventh semiconductor region of a second conductivity type being a conductivity type different from the first conductivity type is arranged at a position overlapped with the third semiconductor region in plan view and deeper than the third semiconductor region,
the third semiconductor region and the seventh semiconductor region constitute a P-N junction, and
an impurity concentration of the third semiconductor region is lower than an impurity concentration of the seventh semiconductor region.

2. The photoelectric conversion apparatus according to claim 1, further comprising:

a third avalanche diode arranged to be adjacent to the second avalanche diode and including an eighth semiconductor region of the first conductivity type, wherein
in plan view, the first avalanche diode and the second avalanche diode are aligned in a first direction, and the second avalanche diode and the third avalanche diode are aligned in a second direction intersecting the first direction, and
in plan view, a contact plug that supplies a potential to one node of the first avalanche diode is arranged between the first semiconductor region and the eighth semiconductor region.

3. The photoelectric conversion apparatus according to claim 2, wherein
a ninth semiconductor region of the second conductivity type is arranged between the first semiconductor region and the eighth semiconductor region,
a fourth semiconductor region of the second conductivity type is arranged between the first semiconductor region and the second semiconductor region,
the contact plug is connected to the ninth semiconductor region, and
an impurity concentration of the fourth semiconductor region is lower than an impurity concentration of the ninth semiconductor region.

4. The photoelectric conversion apparatus according to claim 2, wherein
the contact plug is formed on a first surface of a substrate, and
light is incident from a side of a second surface opposite the first surface of the substrate.

5. The photoelectric conversion apparatus according to claim 2, wherein a first distance between the first semiconductor region and the second semiconductor region is shorter than a second distance between the first semiconductor region and the eighth semiconductor region.

6. The photoelectric conversion apparatus according to claim 5, wherein the first distance is ⅛ or more times the second distance.

7. The photoelectric conversion apparatus according to claim 1, wherein
the first semiconductor region and the second semiconductor region are arranged on a substrate,
a memory or a counter circuit configured to detect an avalanche current generated based on a signal from the first avalanche diode is arranged on a second substrate different from the substrate, and
the substrate and the second substrate are layered.

8. The photoelectric conversion apparatus according to claim 1, wherein trench isolation is applied between the first semiconductor region and the second semiconductor region.

9. The photoelectric conversion apparatus according to claim 8, wherein one end of the trench isolation is formed up to a position deeper than the first semiconductor region.

10. The photoelectric conversion apparatus according to claim 1, wherein the avalanche diode operates in Geiger mode.

11. The photoelectric conversion apparatus according to claim 1, further comprising:
a color filter,
wherein light transmitted through the color filter is incident on the avalanche diode.

12. A photoelectric conversion system comprising:
the photoelectric conversion apparatus according to claim 1; and
a signal processing unit configured to process a signal output by the photoelectric conversion apparatus.

13. A movable object comprising:

the photoelectric conversion apparatus according to claim
1; and distance information obtaining means configured to
obtain distance information on a distance to an object
from ranging information based on a signal from the
photoelectric conversion apparatus, wherein the movable object further comprising control
means configured to control the moving object based
on the distance information.

\* \* \* \* \*